United States Patent
Lee et al.

(10) Patent No.: US 11,397,635 B2
(45) Date of Patent: Jul. 26, 2022

(54) BLOCK QUALITY CLASSIFICATION AT TESTING FOR NON-VOLATILE MEMORY, AND MULTIPLE BAD BLOCK FLAGS FOR PRODUCT DIVERSITY

(71) Applicant: SanDisk Technologies LLC, Addison, TX (US)

(72) Inventors: Shih-Chung Lee, Yokohama (JP); Takashi Murai, Fujisawa (JP); Ken Oowada, Fujisawa (JP)

(73) Assignee: SanDisk Technologies LLC, Addison, TX (US)

( * ) Notice: Subject to any disclaimer, the term of this patent is extended or adjusted under 35 U.S.C. 154(b) by 413 days.

(21) Appl. No.: 16/708,383

(22) Filed: Dec. 9, 2019

(65) Prior Publication Data
US 2021/0173734 A1 Jun. 10, 2021

(51) Int. Cl.
*G06F 11/26* (2006.01)
*G06F 11/07* (2006.01)
(Continued)

(52) U.S. Cl.
CPC ........ *G06F 11/0772* (2013.01); *G06F 11/076* (2013.01); *G06F 11/1489* (2013.01); *G06F 11/3037* (2013.01); *G06F 12/0246* (2013.01); *G06F 13/1668* (2013.01); *G11C 16/349* (2013.01); *G11C 29/12* (2013.01); *G06F 2212/7211* (2013.01); *G11C 2029/1208* (2013.01)

(58) Field of Classification Search
CPC .. G06F 11/076; G06F 11/1489; G06F 11/303; G06F 11/07

USPC ................................ 714/6.1, 6.11, 6.13, 48
See application file for complete search history.

(56) References Cited

U.S. PATENT DOCUMENTS

| 4,975,798 A | * | 12/1990 | Edwards | ................ H02H 3/048 361/57 |
| 8,526,252 B2 | * | 9/2013 | Li | ............................ G11C 11/16 365/201 |

(Continued)

FOREIGN PATENT DOCUMENTS

WO WO-2020015131 A1 * 1/2020 ........... G06F 3/0614

OTHER PUBLICATIONS

International Search Report & The Written Opinion of the International Searching Authority dated Aug. 28, 2020, International Application No. PCT/US2020/024618.

*Primary Examiner* — Chae M Ko
(74) *Attorney, Agent, or Firm* — Vierra Magen Marcus LLP

(57) ABSTRACT

For a non-volatile memory die formed of multiple blocks of memory cells, the memory die has a multi-bit bad block flag for each block stored on the memory die, such as in a fuse ROM. For each block, the multi-bit flag indicates if the block has few defects and is of the highest reliability category, is too defective to be used, or is in of one of multiple recoverability categories. The multi-bit bad blocks values can be determined as part a test process on fresh devices, where the test of a block can be fail stop for critical category errors, but, for recoverable categories, the test continues and tracks the test results to determine a recoverability category for the block and write this onto the die as a bad block flag for each block. These recoverability categories can be incorporated into wear leveling operations.

18 Claims, 21 Drawing Sheets

(51) Int. Cl.
   *G06F 11/14*   (2006.01)
   *G06F 11/30*   (2006.01)
   *G06F 13/16*   (2006.01)
   *G11C 29/12*   (2006.01)
   *G11C 16/34*   (2006.01)
   *G06F 12/02*   (2006.01)

(56) References Cited

U.S. PATENT DOCUMENTS

| | | | |
|---|---|---|---|
| 9,997,258 B2 | 6/2018 | Shepard et al. | |
| 10,223,018 B2 | 3/2019 | Gunnam et al. | |
| 10,223,216 B1 | 3/2019 | Dubeyko et al. | |
| 10,346,266 B2 | 7/2019 | Dubeyko et al. | |
| 2006/0098484 A1* | 5/2006 | Roohparvar | G06F 11/073 |
| | | | 365/230.03 |
| 2009/0282301 A1* | 11/2009 | Flynn | G06F 12/0246 |
| | | | 714/763 |
| 2009/0327822 A1* | 12/2009 | Kameda | G06F 11/1068 |
| | | | 714/E11.02 |
| 2010/0002512 A1 | 1/2010 | Cornwell et al. | |
| 2010/0228807 A1* | 9/2010 | Langhammer | H03K 5/1252 |
| | | | 708/209 |
| 2010/0241914 A1* | 9/2010 | Chen | G11C 29/16 |
| | | | 711/E12.001 |
| 2012/0173920 A1* | 7/2012 | Park | G11C 16/3495 |
| | | | 714/49 |
| 2013/0070547 A1* | 3/2013 | Pyeon | G11C 29/44 |
| | | | 365/200 |
| 2013/0286742 A1* | 10/2013 | Komine | G11C 29/025 |
| | | | 365/185.19 |
| 2014/0071756 A1* | 3/2014 | Iwai | H01L 27/1157 |
| | | | 365/185.11 |
| 2015/0117099 A1 | 4/2015 | Raghu et al. | |
| 2015/0134885 A1* | 5/2015 | Yeung | G06F 12/0246 |
| | | | 711/103 |
| 2015/0287478 A1* | 10/2015 | Chen | G11C 29/44 |
| | | | 714/719 |
| 2016/0019111 A1* | 1/2016 | Kochar | G06F 12/08 |
| | | | 714/6.12 |
| 2019/0237153 A1 | 8/2019 | Hong et al. | |
| 2020/0327953 A1* | 10/2020 | Fleming | G11C 29/4401 |

* cited by examiner

Figure 6E
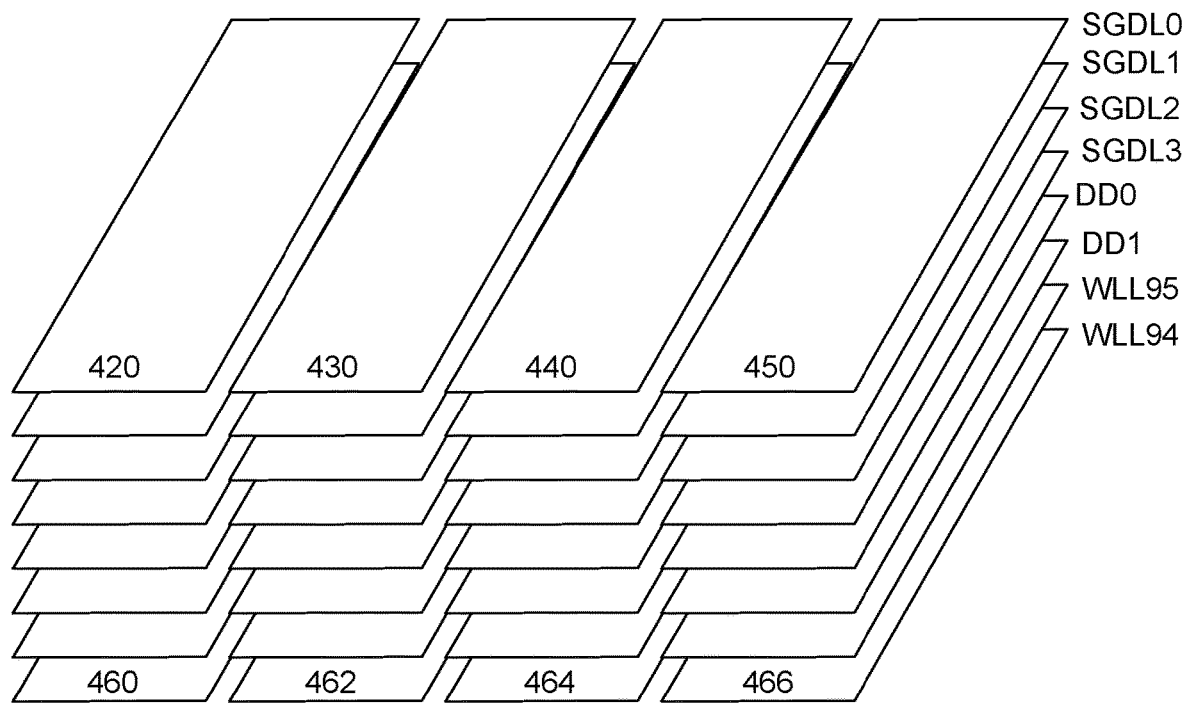
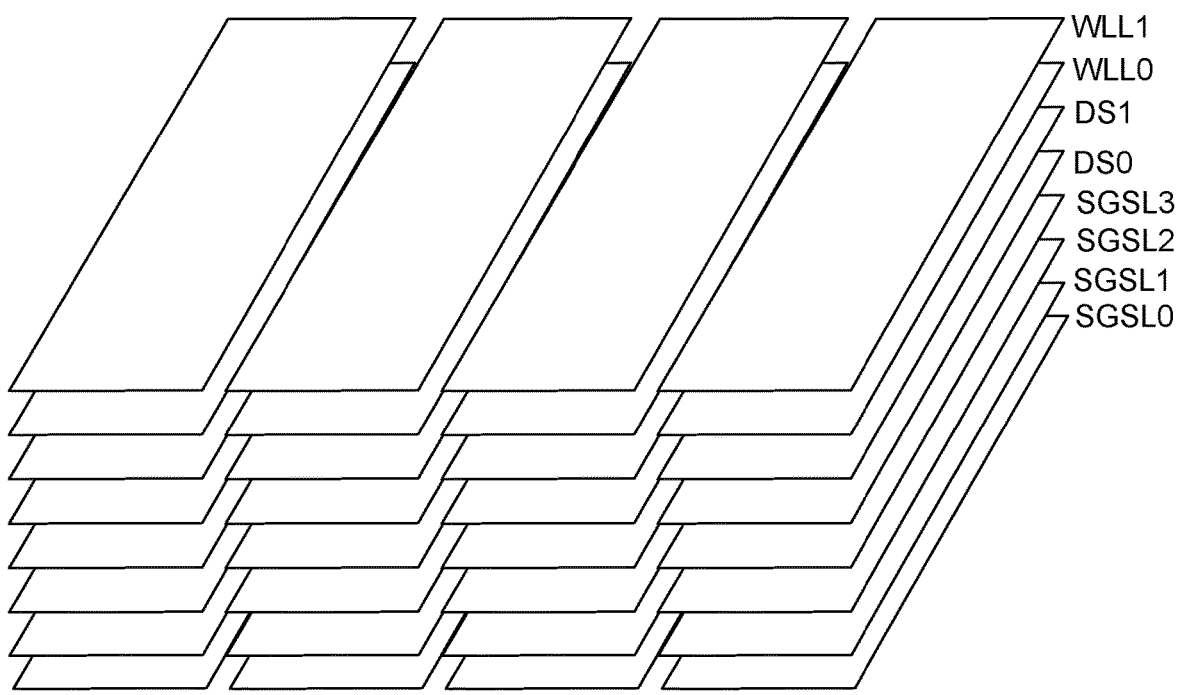

| DS Categories | Cat1 | O:pass | X:fail | Cat4 | ..... | Final BBK flag stored in ROM fuse |
| --- | --- | --- | --- | --- | --- | --- |
| BLK address | | Cat2 | Cat3 | | | |
| 0 | O | O | O | O | O | O |
| 1 | O | X | - | - | - | X |
| 2 | O | O | O | X | - | X |
| 3 | O | O | O | O | O | O |
| 4 | O | O | X | - | - | X |
| 5 | O | O | O | O | O | O |
| 6 | O | O | O | O | O | O |
| 7 | X | - | - | - | - | |
| 8 | O | O | O | O | O | O |
| 9 | O | O | O | O | O | O |
| A | O | O | O | O | O | O |
| B | O | O | X | - | O | X |
| C | O | O | O | O | O | O |
| D | O | O | O | O | O | O |
| E | O | X | - | - | - | X |
| F | X | - | - | - | - | X |

Figure 8

DS Categories   O:pass   X:fail

| BLK address | Cat1 | Cat2 critical | Cat3 | Cat4 | Cat5 critical | CatN-1 | CatN | Recoverability level | BBK flag |
|---|---|---|---|---|---|---|---|---|---|
| 0 | O | O | O | O | O | O | O | O | 000 |
| 1 | O | X | - | - | - | - | - | X | 111 |
| 2 | O | O | X | O | O | O | O | R1 | 001 |
| 3 | X | O | O | O | O | O | O | R2 | 010 |
| 4 | X | O | X | O | O | O | O | R3 | 011 |
| 5 | X | O | X | X | X | - | - | X | 111 |

Figure 10

BLOCK QUALITY CLASSIFICATION AT TESTING FOR NON-VOLATILE MEMORY, AND MULTIPLE BAD BLOCK FLAGS FOR PRODUCT DIVERSITY

BACKGROUND

Semiconductor memory is widely used in various electronic devices such as cellular telephones, digital cameras, personal digital assistants, medical electronics, mobile computing devices, non-mobile computing devices and data servers. Semiconductor memory may comprise non-volatile memory, volatile memory or both. Non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others.

Memory devices will often have defects that occur as part of the fabrication process. After being manufactured and before being sent out to consumers, the memory die are usually put through a series of tests to determine defective portions of the circuit, both of the memory cells and also of peripheral elements. If a device has too many defects, it may be discarded or only used for less demanding applications, while in other cases the defective portions of the memory die can be marked and avoided when the device is in use. For example, the memory cells of a device will often be divided up into blocks and as part of the test process a flag value, such as in a fuse ROM on the memory die, can be set for the defective memory blocks and then these blocks will be not be used when the device is in operation.

BRIEF DESCRIPTION OF THE DRAWINGS

Like-numbered elements refer to common components in the different figures.

FIG. 6E depicts a view of the select gate layers and word line layers.

FIG. 8 is a table illustrating the result of a fail stop die sort.

FIG. 10 is a table illustrating the result of a die sort in which blocks are considered passed for the next die sort category if they pass relaxed criteria, but that is fail stop if the block fails in a critical fail category.

DETAILED DESCRIPTION

Prior to usage, non-volatile memory die are typically subjected to a sequence of tests to determine the quality of the blocks of memory cells on the memory die. The blocks are typically grouped into good blocks, having few or no defects, and bad blocks, having a higher number of defects. Within the group of blocks that would typically have been marked as bad there will often be a number of blocks that are recoverable to varying degrees. For example, a block may have too many defects for use in high endurance applications, but may be recovered for use in applications in which the block would be subjected to fewer program/erase cycles.

In embodiments presented below, during the test process for a memory die before the die is put into customer use, the memory die is subjected to a sequence of tests. When a memory die fails a test, the result is recorded but the test continues on to complete the rest of the test's operations, unless the failed test is a critical category test. Results of the test can then be recorded on the memory die, such as by being written into a fuse ROM on the memory die, as a multi-bit bad block flag indicating a recoverability category for each of the blocks on the memory die. In some embodiments, these multi-bit bad block flags can be used when selecting memory die to assemble into multi-die memory packages. The multi-bit bad block flags can also be used during operation of a memory system, where the memory controller can access these multi-bit bad block flags during power on and use the blocks' recoverability categories during memory system operations, such as for the selection of blocks to which data will be written as part of wear leveling operations.

Figure 1:
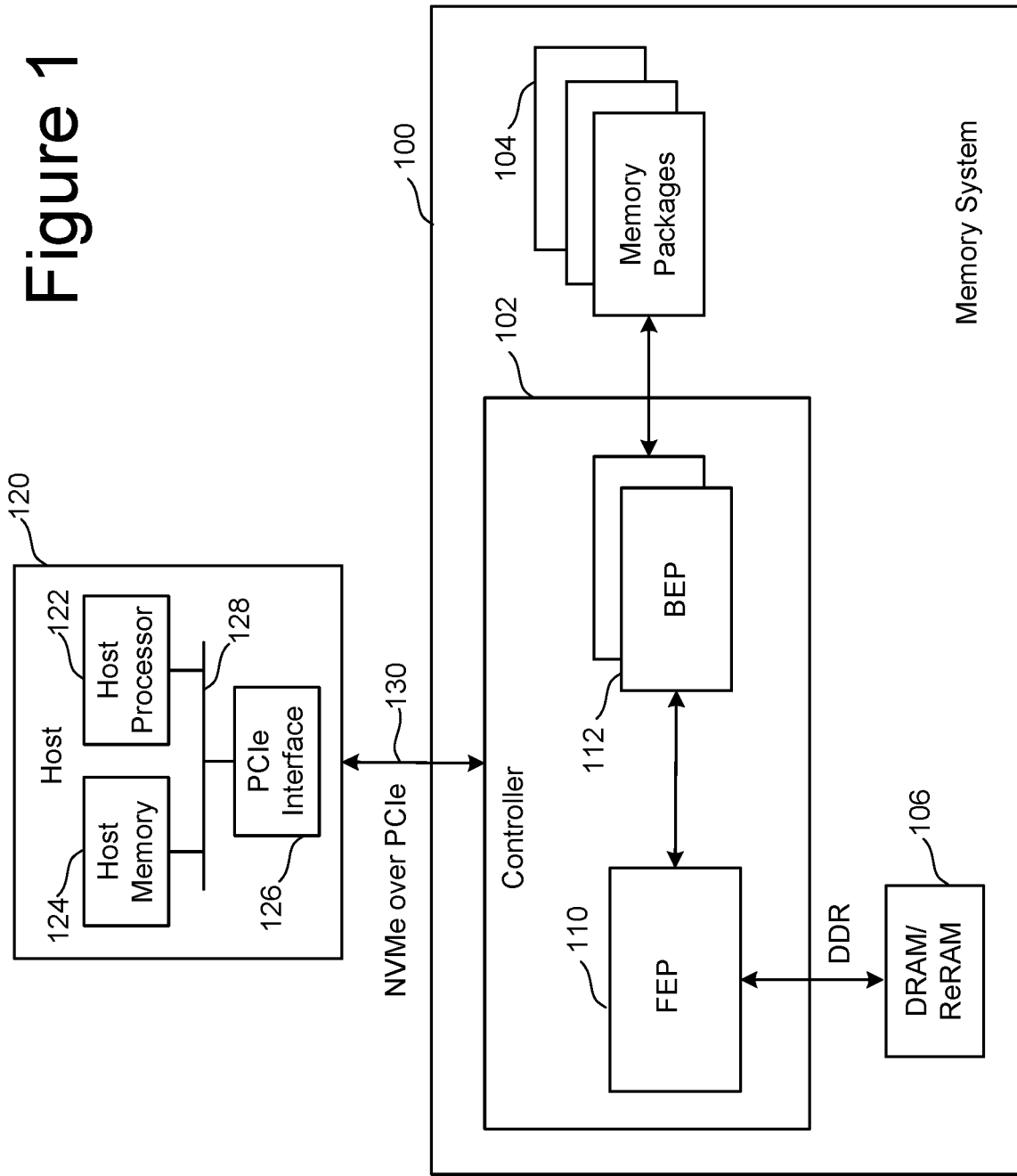
FIG. 1 is a block diagram of one embodiment of a memory system connected to a host.

FIG. 1 is a block diagram of one embodiment of a memory system 100 connected to a host 120. Many different types of memory systems can be used with the technology proposed herein. Example memory systems include solid state drives ("SSDs"), memory cards and embedded memory devices; however, other types of memory systems can also be used.

Memory system 100 of FIG. 1 comprises a controller 102, non-volatile memory 104 for storing data, and local memory (e.g. DRAM/ReRAM) 106. Controller 102 comprises a Front End Processor (FEP) circuit 110 and one or more Back End Processor (BEP) circuits 112. In one embodiment FEP circuit 110 is implemented on an application-specific integrated circuit ("ASIC"). In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction code (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126 connected along bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 2:
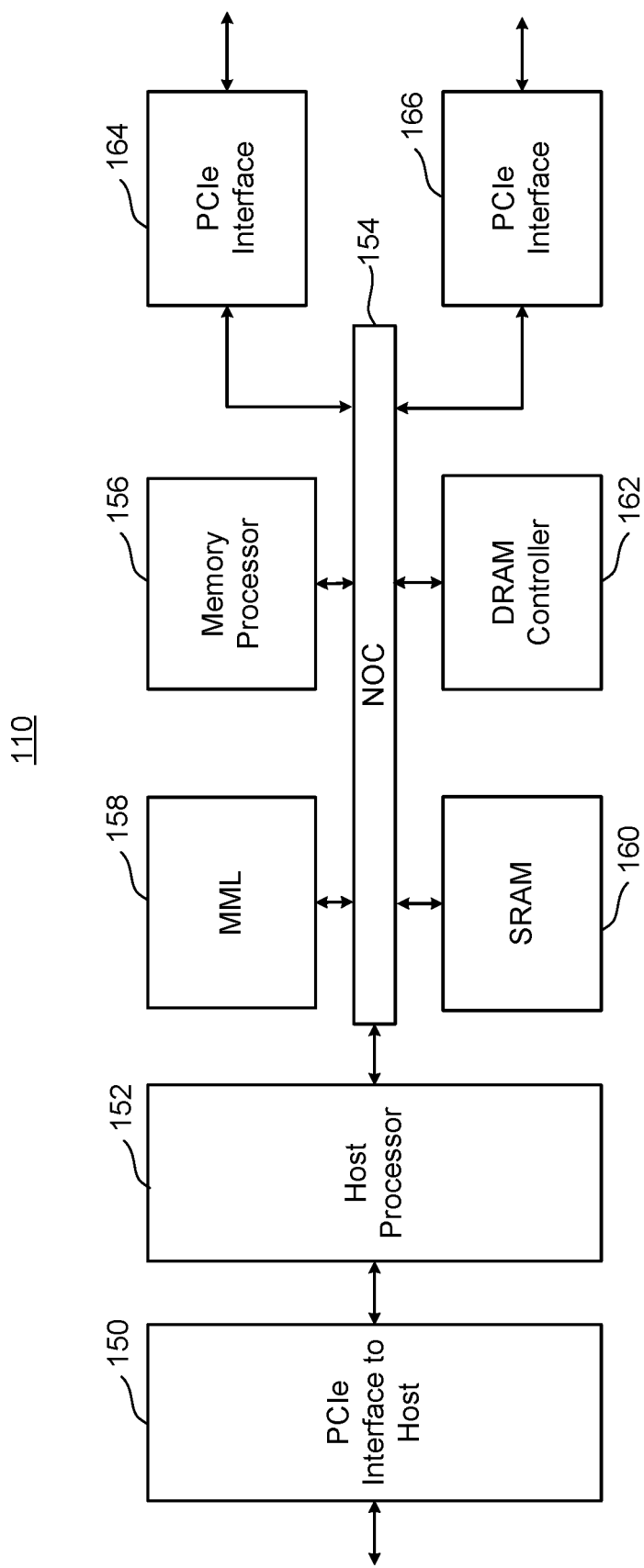
FIG. 2 is a block diagram of one embodiment of a Front End Processor Circuit. In some embodiments, the Front End Processor Circuit is part of a controller.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 326 of FIG. 5 below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

Figure 3:
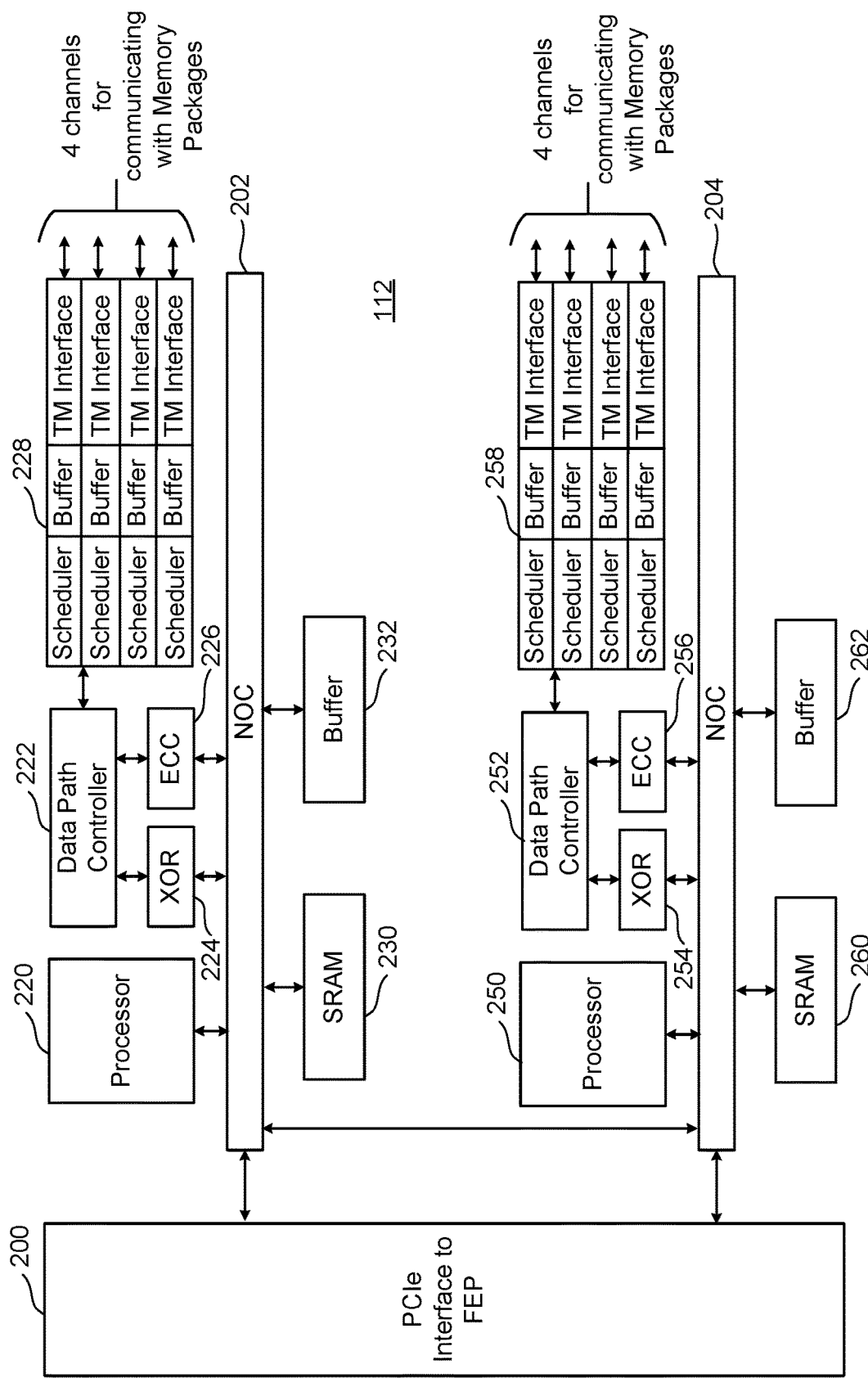
FIG. 3 is a block diagram of one embodiment of a Back End Processor Circuit. In some embodiments, the Back End Processor Circuit is part of a controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 4:
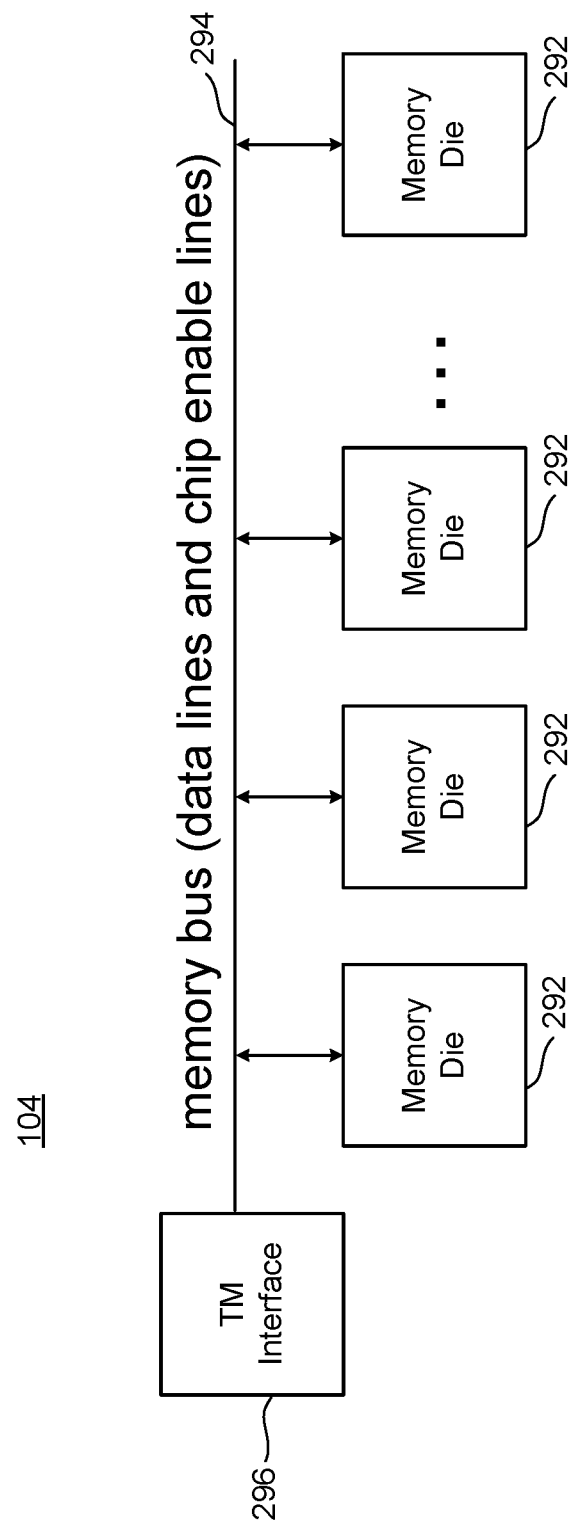
FIG. 4 is a block diagram of one embodiment of a memory package.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 5:
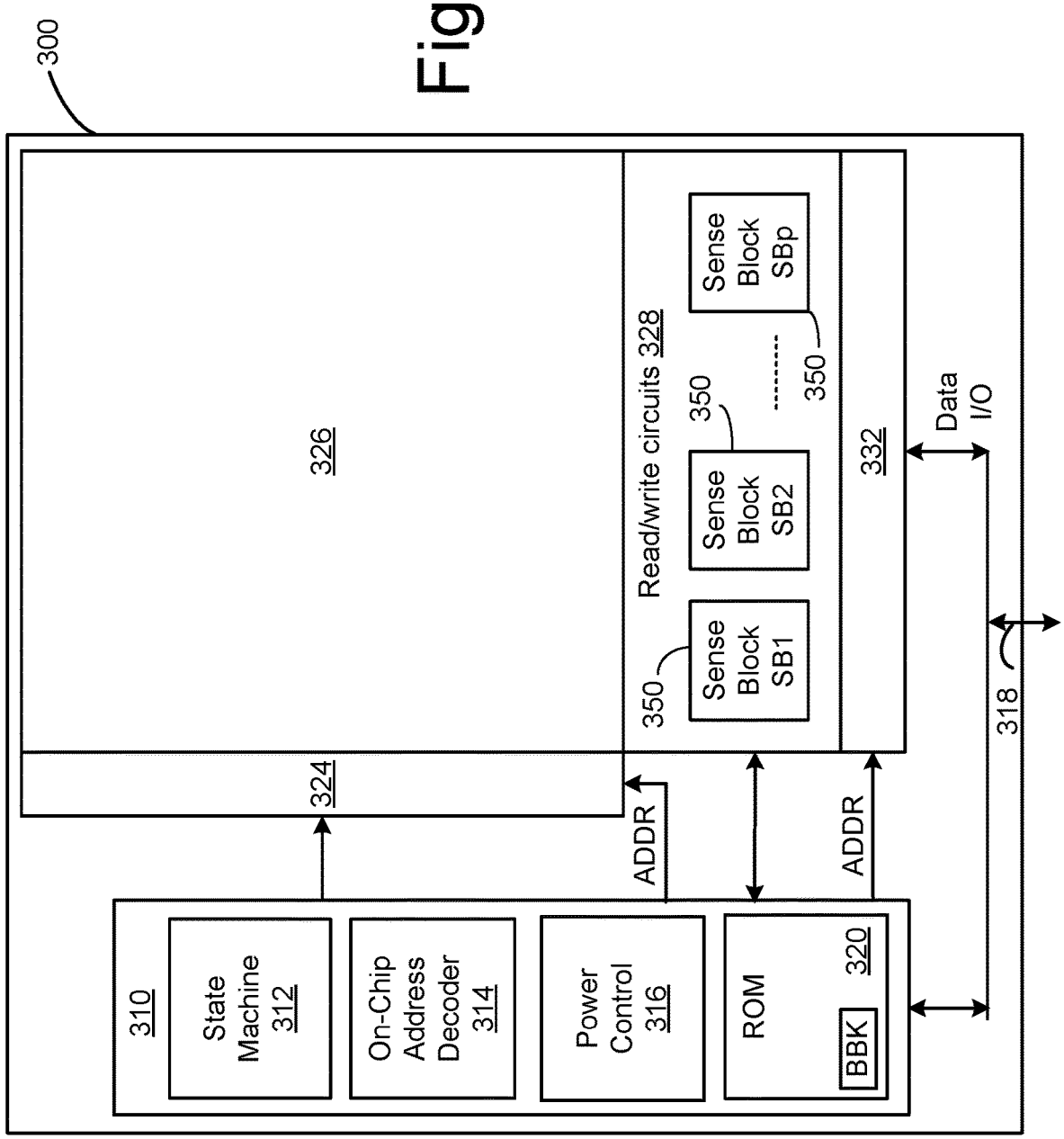
FIG. 5 is a block diagram of one embodiment of a memory die.

FIG. 5 is a functional block diagram of one embodiment of a memory die 300. The components depicted in FIG. 5 are electrical circuits. In one embodiment, each memory die 300 includes a memory structure 326, control circuitry 310, and read/write circuits 328. Memory structure 126 is addressable by word lines via a row decoder 324 and by bit lines via a column decoder 332. The read/write circuits 328 include multiple sense blocks 350 including SB1, SB2, . . . , SBp (sensing circuitry) and allow a page of memory cells to be read or programmed in parallel. Commands and data are transferred between the controller and the memory die 300 via lines 318. In one embodiment, memory die 300 includes a set of input and/or output (I/O) pins that connect to lines 318.

Control circuitry 310 cooperates with the read/write circuits 328 to perform memory operations (e.g., write, read, and others) on memory structure 326, and includes a state machine 312, an on-chip address decoder 314, a power control circuit 316. State machine 312 provides die-level control of memory operations. In one embodiment, state machine 312 is programmable by software. In other embodiments, state machine 312 does not use software and is completely implemented in hardware (e.g., electrical circuits). In another embodiment, state machine 312 is replaced by a micro-controller. In one embodiment, control circuitry 310 includes buffers such as registers, ROM 320 (such as a fuse ROM), and other storage for storing default values such as base voltages and other parameters.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages. The sense blocks include bit line drivers.

The ROM 320 can be used to store various device parameters that can be used by the on-die control circuitry 310 and the memory controller 102 for the operation of the memory die 300. One example of parameters is a set of bad block (BBK) flags that can be used to indicate whether the individual blocks of an array of the memory structure 326 are defective and should not be used or should have restrictions on their usage. As discussed in more detail below, these flag values can be determined as part of an initial test process, or die sort, and set as fuse values in the ROM 320. Depending on the embodiment, this could be a single flag per block to indicate defective blocks that are not to be used or a multi-bit flag value indicating a defective type of a block, such as the category or degree of defects within the corresponding block and the degree to which it may be recoverable. As part of a power on sequence, these bad block flags can be read out by the on-die control circuitry 310 and transferred out to the controller 102 where they can be used, for example, when assigning logical blocks to physical blocks of the array or memory structure 326 or performing wear leveling operations. In some embodiments, the multi-bit flag values could be used to weight the program/erase (P/E) counts or other factors used in the selection of blocks so that if the flags indicate a block has a lower expected endurance its P/E count would be weighted to a higher value to account for this.

For purposes of this document, the phrase "one or more control circuits" can refer to the controller 102 and/or on-die control circuitry, such as a controller, a state machine, a micro-controller and/or control circuitry 310, or other analogous circuits that are used to control non-volatile memory.

In one embodiment, memory structure 326 comprises a three dimensional memory array of non-volatile memory cells in which multiple memory levels are formed above a single substrate, such as a wafer. The memory structure 326 may comprise any type of non-volatile memory that are monolithically formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the embodiments described herein. Other examples of suitable technologies for memory cells of the memory structure 326 include ReRAM memories (resistive random access memories), magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two dimensional arrays, three dimensional arrays, cross-point arrays, stacked two dimensional arrays, vertical bit line arrays, and the like.

Much of the following discussion relates to sub-divisions, or blocks, of the memory array or structure 326, the determination and recordation of determined defects within these blocks, and the use of this information during operation of the memory. To provide a concrete example, the following discussion is largely presented in the context of a three-dimensional NAND embodiment and the blocks are taken to correspond to the erase blocks of the NAND flash structure; however, it will be understood that the techniques can be readily extended to other memory technologies and other array sub-divisions, although the particulars of the types of defects will vary from one memory technology to another.

Figure 6A:
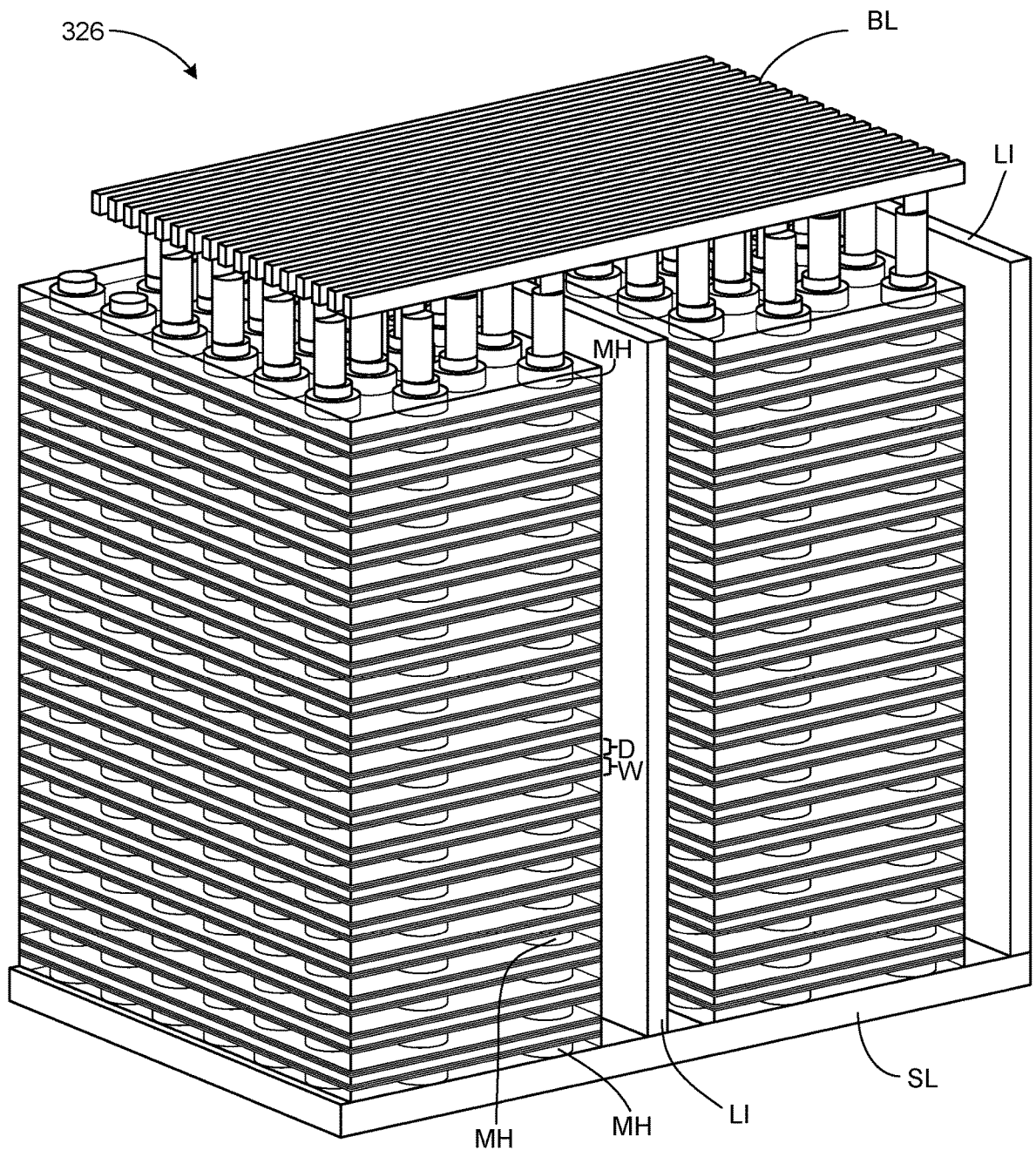
FIG. 6A is a perspective view of a portion of one embodiment of a monolithic three dimensional memory structure.

FIG. 6A is a perspective view of a portion of one example embodiment of a monolithic three-dimensional (3D) memory array that can correspond to memory structure 326, which includes a plurality non-volatile memory cells. For example, FIG. 6A shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. As will be explained below, the alternating dielectric layers and conductive layers are divided into four "fingers" by local interconnects LI. FIG. 6A shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 6A, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 326 is provided below with respect to FIGS. 6B-6H.

Figure 6B:
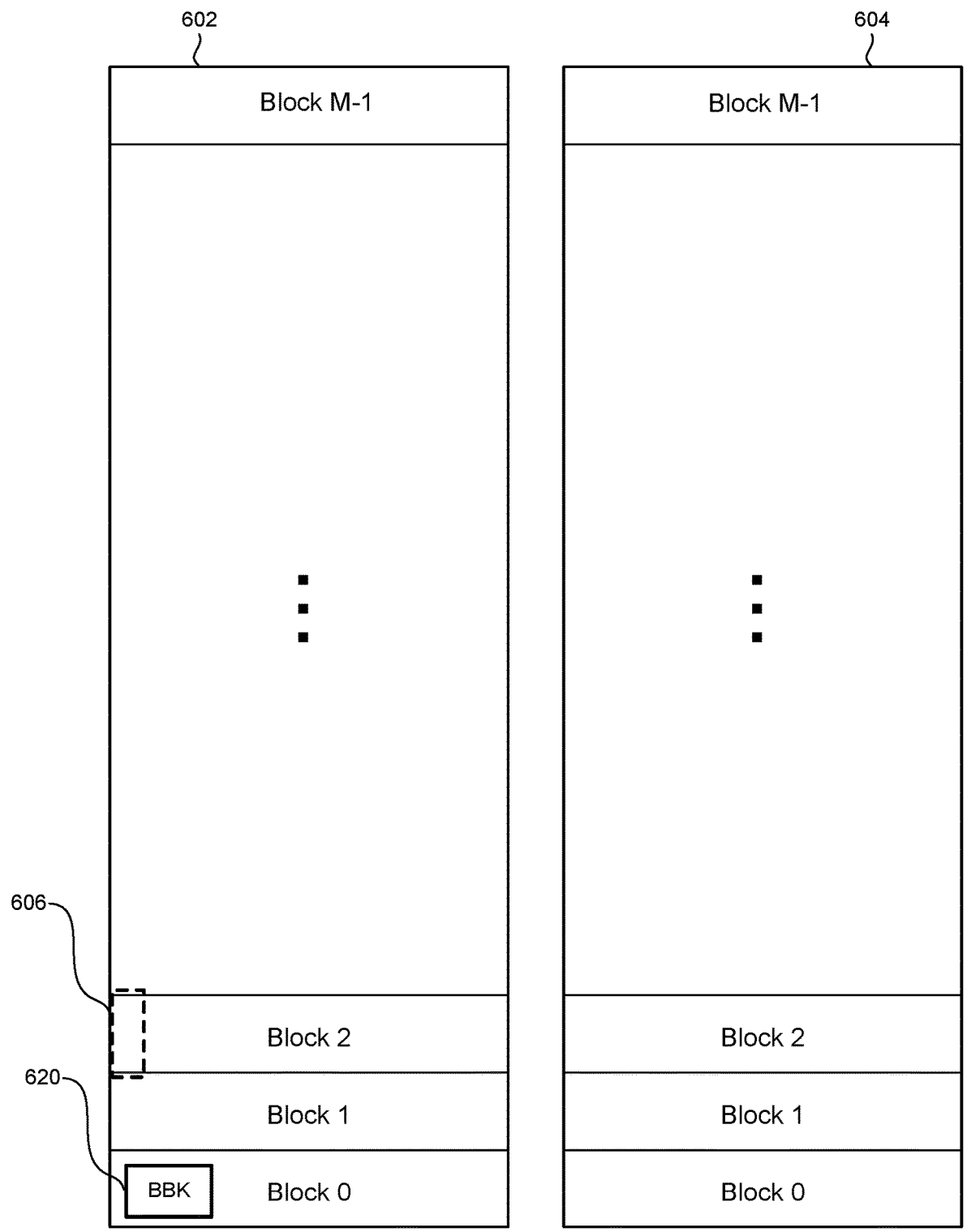
FIG. 6B is a block diagram of a memory structure having two planes.

FIG. 6B is a block diagram explaining one example organization of memory structure 326, which is divided into two planes 602 and 604. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, memory cells can be grouped into blocks for other reasons, such as to organize the memory structure 326 to enable the signaling and selection circuits. In some embodiments, a block represents a group of connected memory cells as the memory cells of a block share a common set of word lines. The memory blocks can be used to store both user data received from a host 120 and also to store system data, such as operating parameters and other data that the memory die 300 or controller 102 can use for operating the memory system 100. For example, as shown in FIG. 6B block 0 620 of plane 602 is used for storing system data, such as the bad block flags BBK that are discussed in more detail below. The system data block 620 is here shown in Block 0, but can be located in other blocks and its content can be used similarly to the ROM 320, either in place of or in conjunction with ROM 320.

Figure 6C:
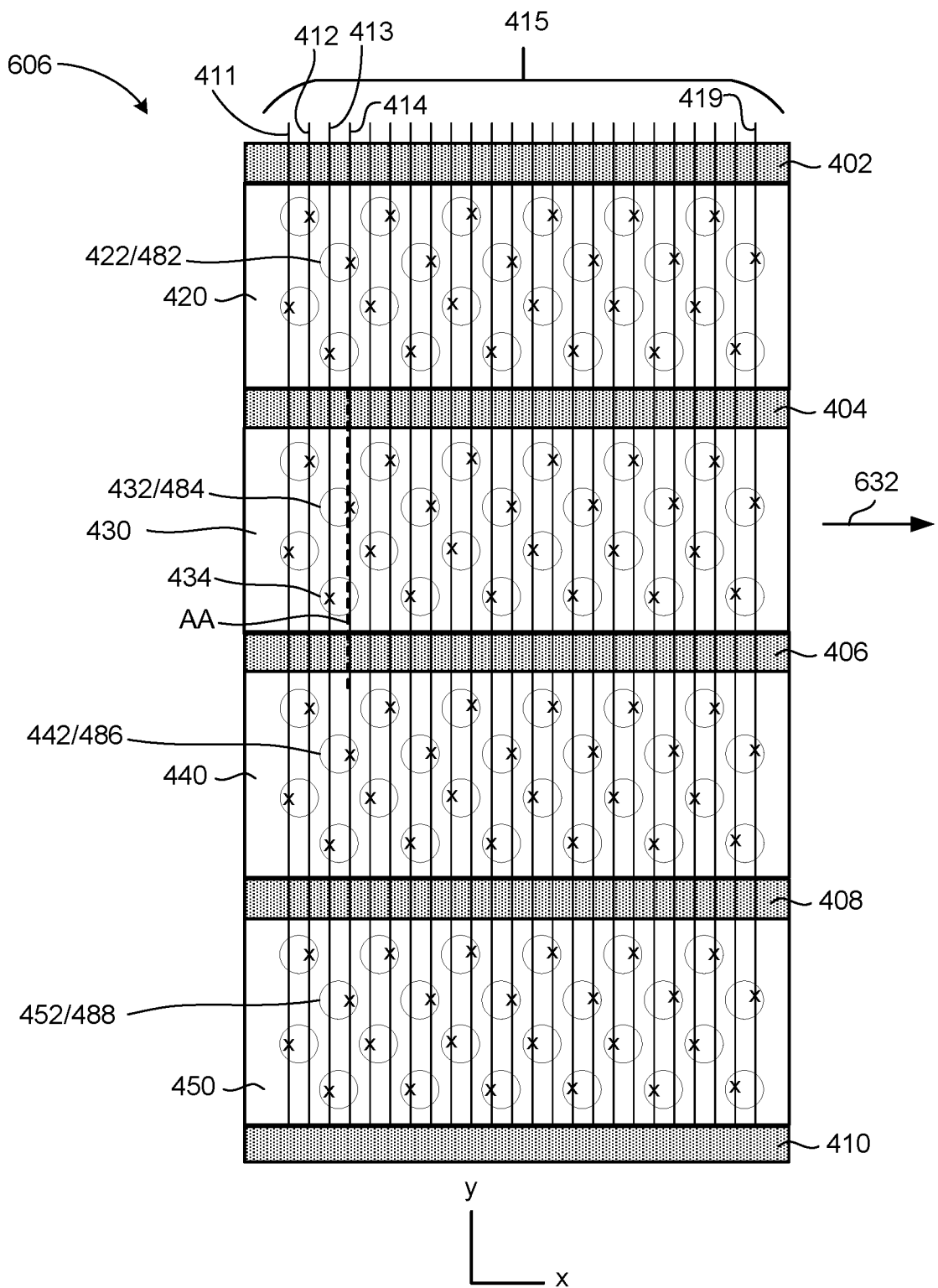
FIG. 6C depicts a top view of a portion of a block of memory cells.

FIGS. 6C-6H depict an example 3D NAND structure that corresponds to the structure of FIG. 6A and can be used to implement memory structure 326 of FIG. 5. FIG. 6C is a block diagram depicting a top view of a portion of one block from memory structure 326. The portion of the block depicted in FIG. 6C corresponds to portion 606 in block 2 of FIG. 6B. As can be seen from FIG. 6C, the block depicted in FIG. 6C extends in the direction of arrow 632. In one embodiment, the memory array has many layers; however, FIG. 6C only shows the top layer.

FIG. 6C depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 6C depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 6C extends in the direction of arrow 632, the block includes more vertical columns than depicted in FIG. 6C FIG. 6C also depicts a set of bit lines 415, including bit lines 411, 412, 413, 414, . . . 419. FIG. 6C shows twenty four bit lines because only a portion of the block is depicted. It is contemplated that more than twenty four bit lines are connected to vertical columns of the block. Each of the circles representing vertical columns has an "x" to indicate its connection to one bit line. For example, bit line 414 is connected to vertical columns 422, 432, 442 and 452.

The block depicted in FIG. 6C includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 6C is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 6C shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 6C also shows the vertical columns being staggered. In other embodiments, different patterns of staggering can be used. In some embodiments, the vertical columns are not staggered.

Figure 6D:
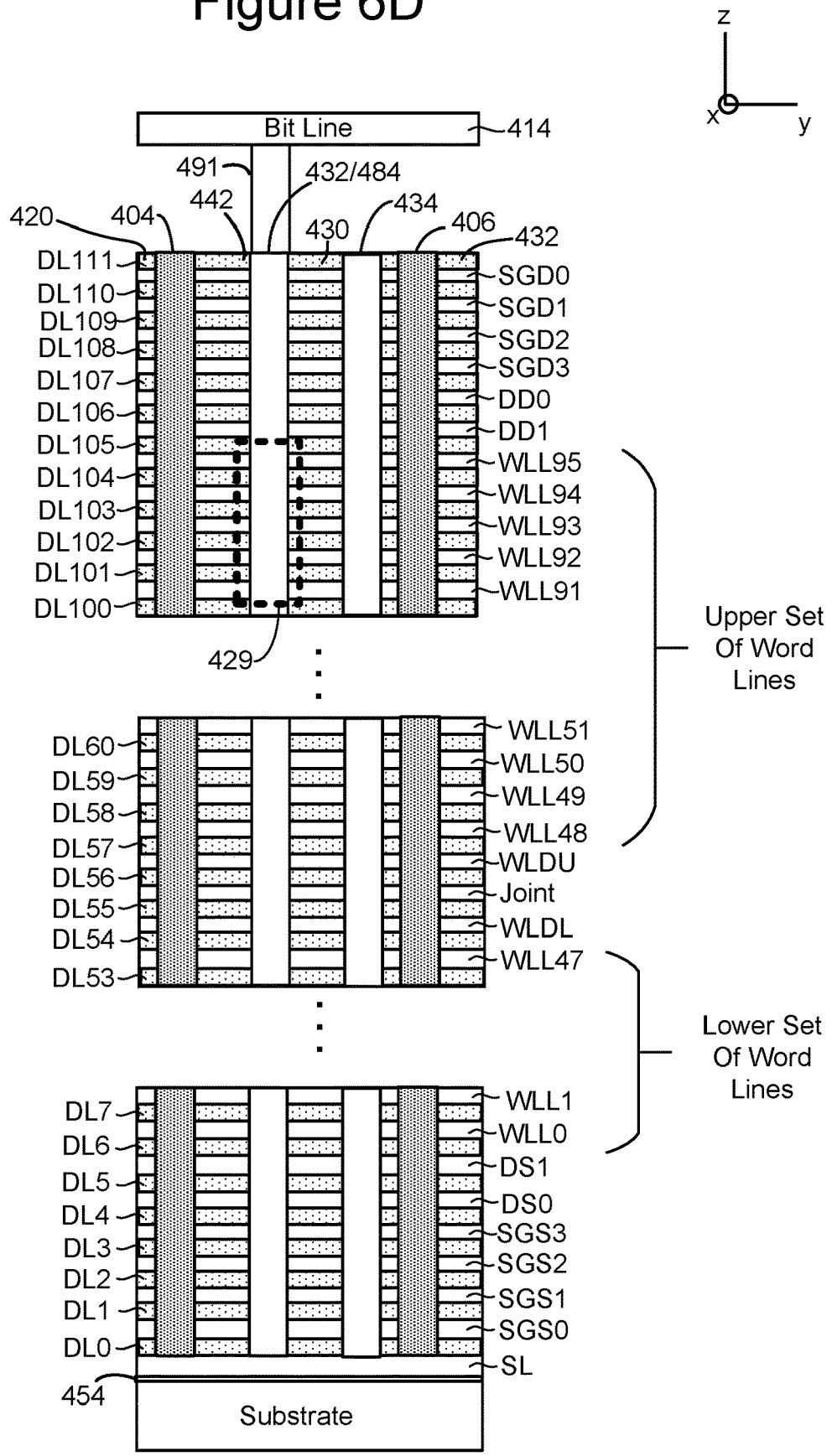
FIG. 6D depicts a cross sectional view of a portion of a block of memory cells.

FIG. 6D depicts a portion of one embodiment of a three dimensional memory structure 326 showing a cross-sectional view. This cross sectional view cuts through vertical columns 432 and 434 and region 430 (see FIG. 6C). The structure of FIG. 6D includes four drain side select layers SGD0, SGD1, SGD2 and SGD3; four source side select layers SGS0, SGS1, SGS2 and SGS3; six dummy word line layers DD0, DD1, DS0, DS1, WLDL, WLDU; and ninety six data word line layers WLL0-WLL95 for connecting to data memory cells. Other embodiments can implement more or less than four drain side select layers, more or less than four source side select layers, more or less than six dummy word line layers, and more or less than ninety six word lines. Vertical columns 432 and 434 are depicted protruding through the drain side select layers, source side select layers, dummy word line layers and word line layers. In one embodiment, each vertical column comprises a vertical NAND string. For example, vertical column 432 comprises NAND string 484. Below the vertical columns and the layers listed below is a substrate, an insulating film 454 on the substrate, and source line SL. The NAND string of vertical column 432 has a source end at a bottom of the stack and a drain end at a top of the stack. As in agreement with FIG. 6C, FIG. 6D show vertical column 432 connected to Bit Line 414 via connector 491. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0, DS1, WLDL and WLDU; and word line layers WLL0-WLL95 collectively are referred to as the conductive layers. In one embodiment, the conductive layers are made from a combination of TiN and Tungsten. In other embodiments, other materials can be used to form the conductive layers, such as doped polysilicon, metal such as Tungsten, or metal silicide. In some embodiments, different conductive layers can be formed from different materials. Between conductive layers are dielectric layers DL0-DL111. For example, dielectric layers DL104 is above word line layer WLL94 and below word line layer WLL95. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL95 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 6D also shows a joint area. In one embodiment it is expensive and/or challenging to etch ninety six word line layers intermixed with dielectric layers. To ease this burden, one embodiment includes laying down a first stack of forty eight word line layers alternating with dielectric layers, laying down the joint area, and laying down a second stack of forty eight word line layers alternating with dielectric layers. The joint area is positioned between the first stack and the second stack. The joint area is used to connect to the first stack to the second stack. In FIG. 6D, the first stack is labeled as the "Lower Set of Word Lines" and the second stack is labeled as the "Upper Set of Word Lines." In one embodiment, the joint area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 6D.

FIG. 6E depicts a logical representation of the conductive layers (SGDL0, SGDL1, SGDL2, SGDL3, SGSL0, SGSL1, SGSL2, SGSL3, DDL0, DDL1, DSL0, DSL1, and WLLL0-WLLL95) for the block that is partially depicted in FIG. 6D. As mentioned above with respect to FIG. 4B, in one embodiment local interconnects 402, 404, 406, 408 and 410 break up the conductive layers into four regions/fingers (or subblocks). For example, word line layer WLL94 is divided into regions 460, 462, 464 and 466. For word line layers (WLL0-WLL127), the regions are referred to as word line fingers; for example, word line layer WLL126 is divided into word line fingers 460, 462, 464 and 466. For example, region 460 is one word line finger on one word line layer. In one embodiment, the four word line fingers on a same level are connected together. In another embodiment, each word line finger operates as a separate word line.

Drain side select gate layer SGDL0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 6F:
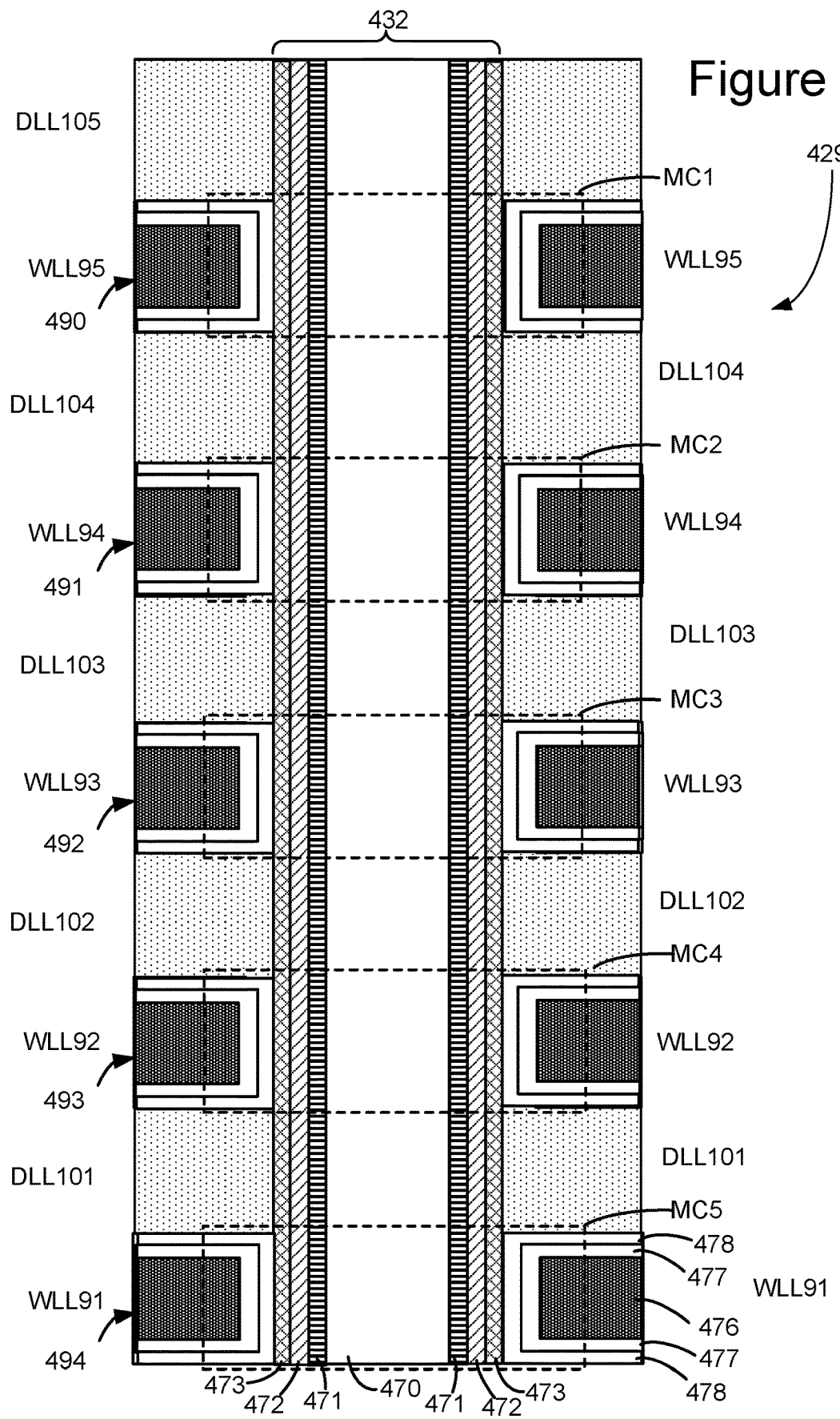
FIG. 6F is a cross sectional view of a vertical column of memory cells.

FIG. 6F depicts a cross sectional view of region 429 of FIG. 6D that includes a portion of vertical column 432 (a memory hole). In one embodiment, the vertical columns are round; however, in other embodiments other shapes can be used. In one embodiment, vertical column 432 includes an inner core layer 470 that is made of a dielectric, such as $SiO_2$. Other dielectric materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 6F depicts dielectric layers DLL105, DLL104, DLL103, DLL102 and DLL101, as well as word line layers WLL95, WLL94, WLL93, WLL92, and WLL91. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 6G:
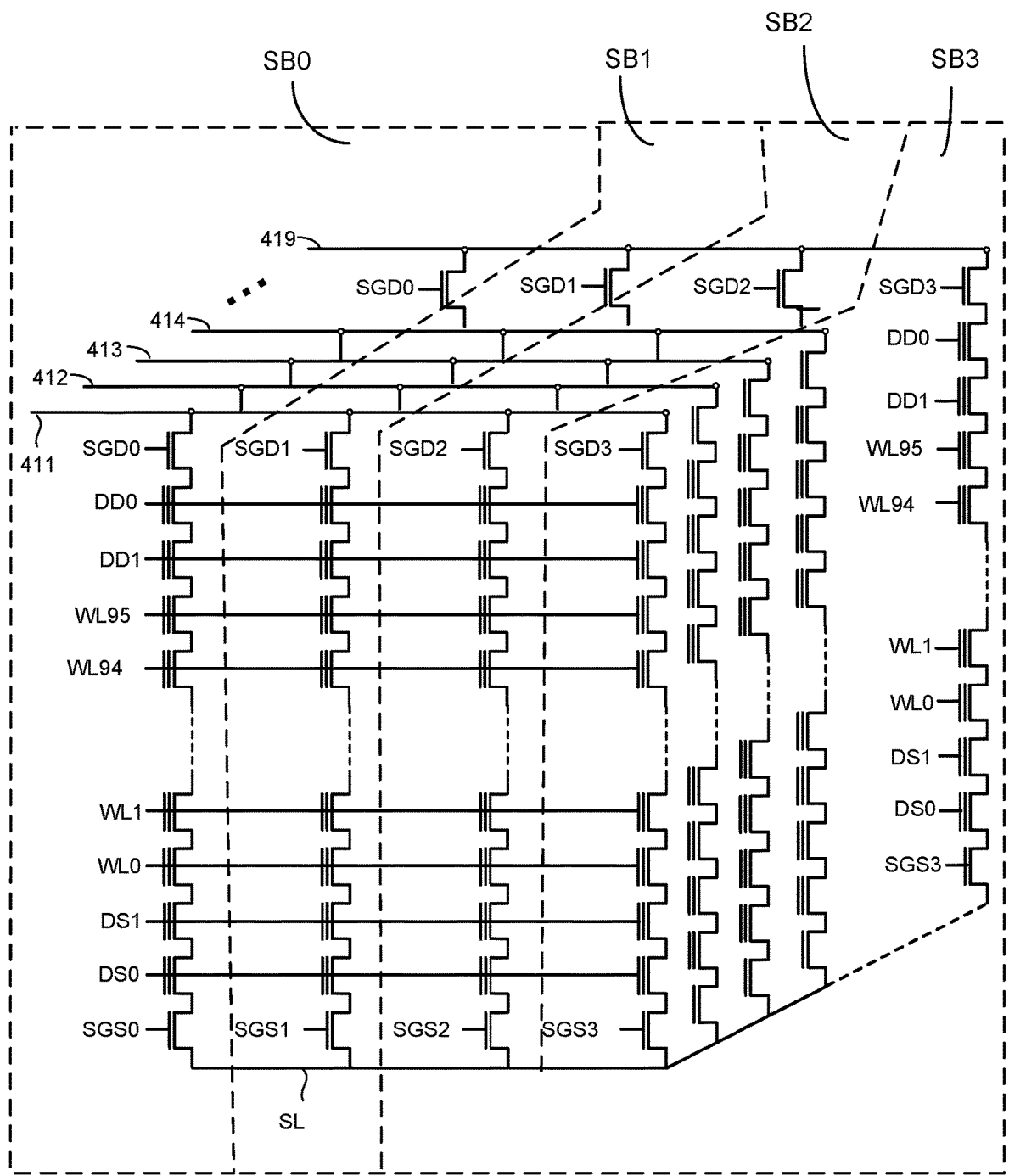
FIG. 6G is a schematic of a plurality of NAND strings showing multiple sub-blocks.

FIG. 6G is a schematic diagram of a portion of the memory depicted in in FIGS. 6A-6F. FIG. 6G shows physical word lines WL0-WL95 running across the entire block, corresponding to the word line layers WLL0-WLL95. The structure of FIG. 6G corresponds to portion 606 in Block 2 of FIGS. 6B-6F, including bit lines 411, 412, 413, 414, . . . 419. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

The memory structure of FIGS. 6A-6F is a complex structure having many processing steps involved in its formation. A number of different defects can occur in the fabrication process. One example is an "open memory hole", in which (referring to FIG. 6A) a memory hole MU is not well connected to the corresponding bit line BL by way of connector 491 (FIG. 6D). In other cases, select gates or memory cells may not be properly formed, so that a NAND string cannot be selected or de-selected, or a memory cell does not program or read properly. Other defects can include word lines or select lines that are broken or have a short or leak to an adjoining select line or word line due to processing variations in the thicknesses of the many layers.

Due to such defects, a block of the memory many be unusable or, even if usable, have reduced performance or reduced endurance. To determine the presence of defects, subsequent to manufacture and prior to being sent out to customers, the memory device can be subjected to a "die sort" in which it undergoes a series of tests of the memory structure and peripheral circuitry. Such tests are performed on anew or "fresh" memory die prior to its being assembled into a memory package with other memory die or a controller and put into customer use. The testing is typically done using one or more external devices or equipment connected to the die, although in some embodiments some or all of the testing can be performed by the die itself using a built-in self-test (BIST) process. If a memory die has too many defective blocks, or defects of a particular serious type, the die is discarded. When the defects of a die are limited to a number of specific memory blocks, and the number of such defective blocks is not too great, the defective blocks can be marked on the die and the die still used, but with the marked blocks either not used or used on a restricted basis.

A typical prior art die sort flow uses "fail stop", where once a block fails at one specification of particular category, the die is marked as bad and is not tested in the following parts of the testing sequence. Under this sort of arrangement, each block only has a single corresponding 1-bit bad block (or BBK) flag, marking each of a die's blocks as either GOOD or BAD without any indication of how defective a bad block is or the nature of its defect.

To improve upon this arrangement, the following presents techniques to identify recoverable blocks. Through device evaluation, blocks that have some degree of defect, but that are in recoverable categories and have acceptable degree of risks can be identified. Within these categories, multiple defect specifications for a die can be checked without fail stop. The blocks can then be classified according to these tests and the results logged accordingly by use of multi-bit flag values for each block. For product uses that are not required to meet a strict a specification, blocks can be recovered depending on the classifications, increasing the number good blocks and increasing die yield. Use of a multi-bit bad block (BBK) flag allows for the classified blocks to be recovered during the power on sequence for the memory die. In some embodiments, the multi-bit bad block flag values can be stored in a block of the memory die used for control or system data and accessed by the controller for more flexible and diversified blocks access.

Figure 7:
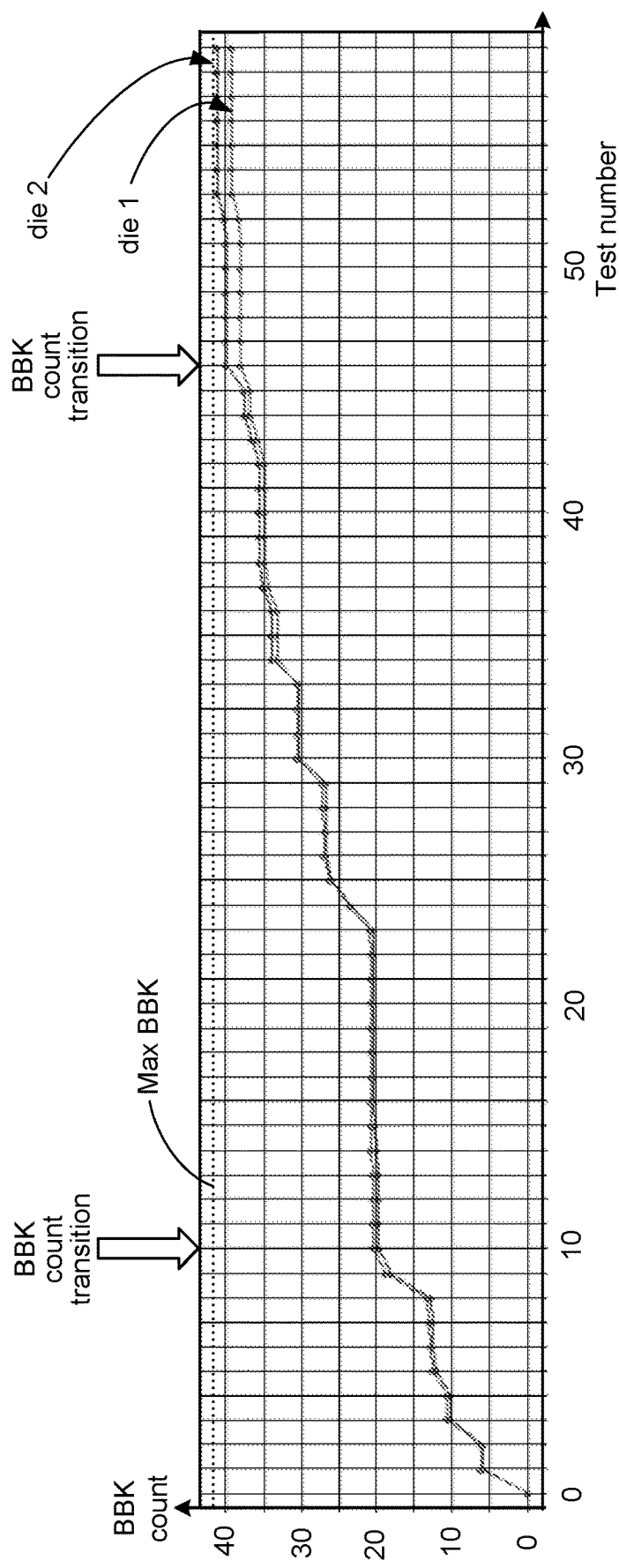
FIG. 7 illustrates one embodiment for the results of a die sort test sequence for the blocks of a non-volatile memory die.

FIG. 7 illustrates one embodiment for the results of a die sort test sequence for the blocks of a non-volatile memory die. The vertical axis in FIG. 7 represents the cumulative bad block count. A memory die is usually designed with some amount of redundant capacity so that it can tolerate losing some number of blocks, but if a die has too many bad blocks, such as illustrated on the vertical axis at MAX, it may be unusable. In some embodiments, if the maximum number of bad blocks is reached, the testing of the die may be stopped.

The horizontal axis of FIG. 7 represents the test number of tests performed as part of the die sort test, where the tests can be for both the memory cells and peripheral elements. The specific tests performed will vary depending on the specifics of the memory structure, and even for a particular type of device and particular set of tests, the order can vary depending on the embodiment. The tests can be ordered based on factors such as grouping tests that share a set of bias values for elements in order to improve efficiency. To take the example of the three-dimensional NAND structure illustrated with respect to FIGS. 6A-6F, the tests can include checking the operation of source side select gates, the operation of drain side select gates, checking for open memory holes (where the horizontal NAND string is not properly connected to the bit line), the operation of the transistors along the dummy word lines memory cells, and multi-state programming and read operations with test data (e.g., random multi-state data), among others.

FIG. 7 illustrates two different memory die (die 1 and die 2) as their blocks undergo the sequence of test during die sort. As the die go through the sequence, the cumulative bad block count increases at some tests, with one or more bad blocks being found, and stays the same when all of the blocks pass. In a fail-stop embodiment, once a block fails at one test it is not checked at subsequent tests. For example, at the first arrow at about 10 tests in, which could correspond to an open memory hole test, multiple blocks are found to fail, so that in a fail stop embodiment the corresponding blocks will be marked as bad and skipped in subsequent tests. Similarly, the second arrow at test about 45 or 50 in the example sequence might, for example, be a multi-level read operation and the blocks failing this test will be marked as bad and skipped in the remaining tests later in the die sort flow of a fail stop embodiment.

FIG. 8 is a table illustrating the result of a fail stop die sort. The first column of FIG. 8 lists the block addresses for the memory die. The next several columns list the test results for a number of different categories of tests. Each category can correspond to a single test or a group tests; for example, all of the tests for source side select gates may be grouped as a single category. The passing of test category is represented as an O and a fail is represented as an X. The specification for passing or failing a given category in some cases may be for a single occurrence of an error or for the number of such errors exceeding some limit. For example, in the case of an open memory hole, as this leads to only one bad memory cell per word line, the memory system may be able to tolerate some number of open memory holes per block as some number of bad bits per page can be tolerated through use of error correction code; however, in the case of a broken or leaking word line, this would result in all of the word line/data page being defective so that even a single occurrence would render a block bad. In a fail stop embodiment, once a block fails the specification for a test category it is not checked in subsequent test. In the example of FIG. 8, block 7 fails at category 1 and is not checked for category 2 and subsequent tests; and block 1 fails at category 2 and is not checked for category 3 and subsequent tests.

The final column of FIG. 8 indicates the die sort (DS categories) of whether the bad block flag of the corresponding block is set (indicated by an X) or not (indicated by an O). Once the die sort is complete, the corresponding set of flag values can be set in a ROM fuse memory on the die, such as illustrated at 320 of FIG. 5. In other embodiments, the BBK flag values can alternatively, or additionally, be stored in a block of the non-volatile memory that can be one of one or more blocks 620 used for the storage of system data. In the embodiment illustrated with respect to FIG. 8 that uses fail stop and uses a 1 bit bad block flag, the die sort flow considers only a single set of specifications for the bad block determinations, targeting only a single quality, so that a quality classification is not carried out at the block level. During a power on operation for the memory die, only the one set of bad block flags are read out of the memory die's registers and loaded onto the controller and, based on these flags, the blocks marked as bad will not be accessed during memory system operation.

Figure 9:
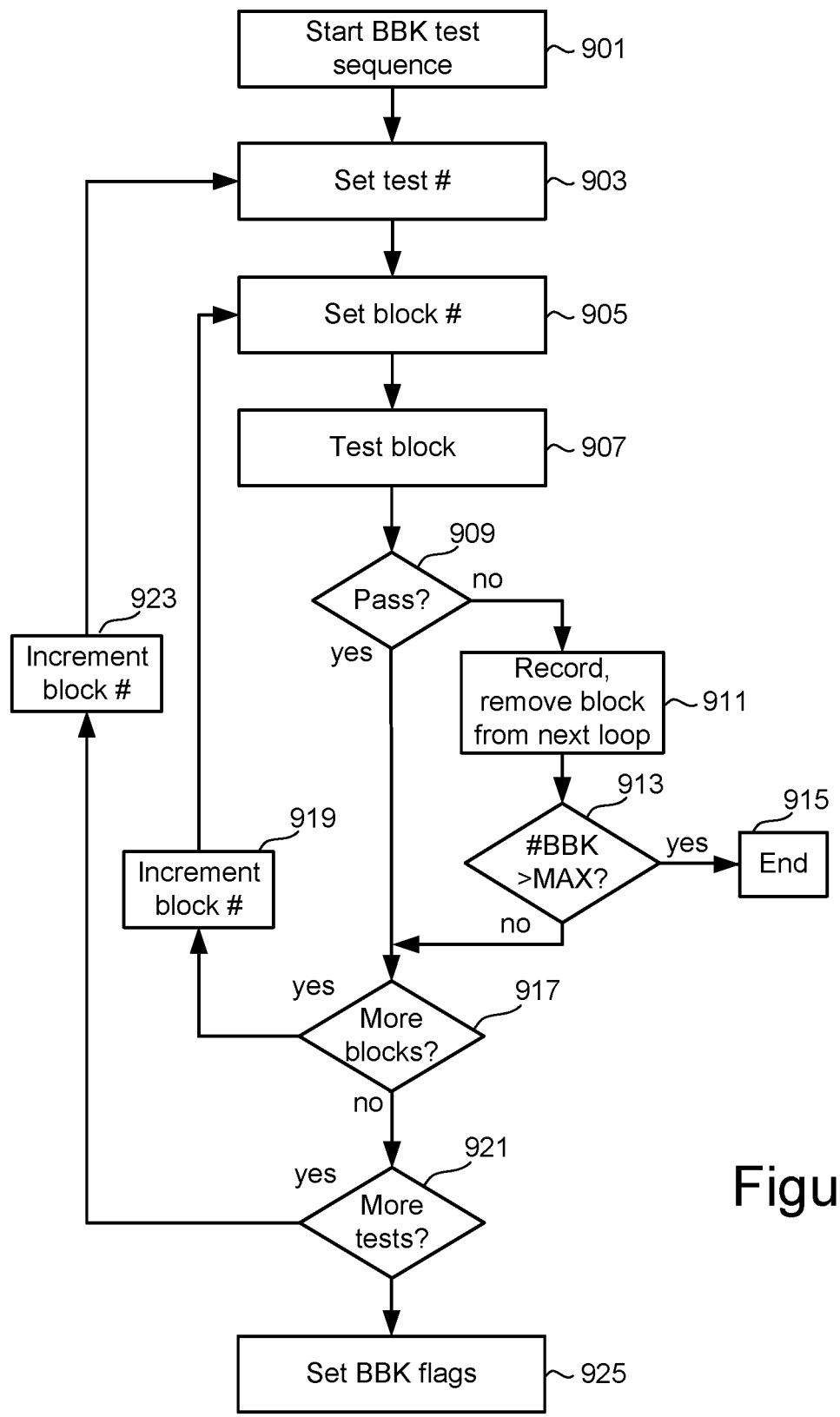
FIG. 9 is a flow chart describing one embodiment of a process for a fail stop die sort process.

FIG. 9 is a flow chart describing one embodiment of a process for a fail stop die sort process, beginning at step 901. The test is selected at step 903, starting with the first test of the die sort sequence, and the block is selected at step 905, starting with the first block in the test order. In the embodiment of FIG. 9, the block loop is placed inside of the test loop, so that a given test is performed for all of the blocks before moving on to the next test, but in other embodiments the test loop can be placed inside of the block loop, so that all of the tests (or all tests until a fail stop) are performed for a block before moving on to the next block.

The selected test is performed on the selected block at step 907 and step 909 determines whether the block passed the test. If the block does not pass the test, at step 911 the selected block is removed from subsequent tests and recorded as bad. In some embodiments, step 913 can be included to determine whether the accumulated number of bad blocks exceeds a maximum value and, if so, then in some embodiments the die sort flow for the die can be ended at step 915. In other embodiments, a determination of whether to reject a die can alternately or additionally be performed near the end of the flow, such as after step 921. If either the block passes the test at step 909, or the accumulated number bad blocks is below the maximum value at 913, the flow goes to step 917 to determine whether there are more blocks for the current test.

Step 917 determines whether there are more blocks to check for the current test and, if so, the flow loops back to step 905 after incrementing the block number at step 919, where any blocks previously determined as bad at step 911 are skipped. If there are no more blocks for the current test, step 921 determines whether there are more tests and, if so, the flow loops back to step 903 after incrementing the test number at step 923. If there are no more tests at step 921, the testing is complete and the bad block flags for the die can be stored on the die at step 925, such as by setting the values in a ROM 320, such as a fuse ROM, or storing them in a system data block 620 of the non-volatile memory array. When the die is subsequently in use, when the die is powered up the bad block flags can be read out by the controller so it can skip the bad blocks when making block assignments.

The number of bad blocks can also be used for grading the memory chips based upon their quality or value. Chips with low numbers of bad blocks of can be selected for high value products in which a high number of program/erase cycles may be needed. The lower grade memory die can be used in applications with a lower specification in terms of program/erase cycles, since a device with fewer spare blocks will have a lower tolerance for acquired defects once in operation.

Rather than use a binary good/bad classification of blocks and a basic fail stop die sort test process, the following discussion introduces quality classification of blocks as part of the test process and uses multiple bad block flags for product diversity. This allows for die with some amount of block defects to be recovered for use in lower grade products, improving yields. More specifically, block quality classifications at die sort and multi-bit flags for storing this information on the die are introduced, providing for product diversity and a more detailed block quality classification that can be provided at power on for a die.

Through device evaluations, defect types and degrees of defect that fall into recoverable categories can be identified. Blocks that pass die sort with lower criteria (qualitative, quantitative, or both) can still be used for products with lower specification requirements. For example, blocks that fail an open memory hole test at a specification of 1-bit per 1000 might pass at a specification of 8-bits per 1000. In another example, a block that fails a multi-level cell (MLC) read at a requirement of no more than 52 bad bits per 1000 might pass for a more relaxed requirement of no more than 80 bad bits per 1000. This higher level of defects may still allow the blocks to successfully operate with the ECC capabilities of the memory system, but allow reduced overhead for additional errors. Consequently, such devices may have lower performance or shorter lifetimes and be less suitable for higher specification products, but can be used for lower specification applications. In this way, having various specifications for open memory hole, multi-level read, and other tests allow for a more complete categorization of the block quality. After testing, the block classification information can be stored as multi-bit bad block flag values, such as in ROM 320 or system data block 620, that can be read to determine the recoverability of a die's blocks, which can then be flexibly enabled depending on a product's specification.

The die sort test sequence can again be as in FIG. 7, but the tests can now include multiple specifications for selected tests, such as for the number of open memory holes, or the number of incorrectly read bits in a multi-state read can be checked against multiple values as described in the preceding paragraph. In some embodiments, the detected errors can be classified as either in a critical fail category or a recoverable category. A critical fail category can include defects such as a word line short, high-leakage, or other defects that result in an amount of error that would make a block unrecoverable. For such critical fail categories, the die sort can again be fail stop. For recoverable fault categories, the die sort flow is not fail stop and can be used to determine and classify blocks that can be recovered for lesser specification products.

FIG. 10 is a table illustrating the result of a die sort in which blocks are considered passed for the next die sort category if they pass the relaxed criteria, but that is fail stop if the block fails in a critical fail category. As in FIG. 8, the first column of FIG. 10 lists block addresses and the next several columns are for different die sort categories. In this example, Category 2 and Category 5 are considered as critical fail categories: for example, Category 2 could correspond to a word line short that would make the whole word line unusable and Category 5 to multi-level read with an extremely high error rate. As represented in FIG. 10, these categories are fail stop, with subsequent tests skipped for blocks with a X for these categories. For the non-critical categories, however, there is no fail stop so that in the case of, for example, block 2, even those this has a fail at Category 3, testing continues. Block 5 illustrates an example where a block fails several non-critical category tests and continues to be tested until it fails at the critical fail category test of Category 5.

Although the processes are described here for an embodiment that determines the defect or recoverability flag information at the block level, other embodiments can alternately or additional determine the flag information at other granularities. For example, the process could also include classification at the sub-block level (e.g., upper and lower sub-blocks, corresponding to the respective regions above or below the joint of FIG. 6D, for example), or at the level of groups of word lines or even individual word lines.

Following the Category N column FIG. 10 includes a Recoverability column. In addition to the critical fail value (indicated by an X) and all pass value (indicated by an O entry) of the embodiment represented in FIG. 8, one or more recoverability levels are indicated by R1, R2, R3, . . . , where R1 is the most recoverable block. If a 3-bit bad block flag is used, six intermediate degrees of recoverability can be encoded in the flag value. The flag value is shown in the final column of FIG. 10, where in this example 000 corresponds to no fails, 111 to a critical fail, and the intermediate values increasing as the degree of recoverability decreases. Although the discussion above has mainly focused on the multi-bit bad block flag values as determined and recorded as part of a device evaluation process of a fresh device and not set by a memory controller (as the process is performed prior to the die being assembled into a memory system), in some embodiments these flag values can be updated to reflect "grown" defects that occur once the device is in use.

The determination of what qualifies as a critical fail category can user defined for a given set of tests. Different users can have different criteria, and even for a given user the criteria the criteria can vary depending on the expected use for the memory circuits. Additionally, both the particular tests and what qualifies as a critical fail category will vary depending on the specifics of the type of memory device being tested, such as memory technology used for the memory cells (e.g., NAND flash memory versus phase change memory) and, even for a given memory technology, the specifics of the memory structure (e.g., three dimensional NAND versus two dimensional NAND).

Figure 11:
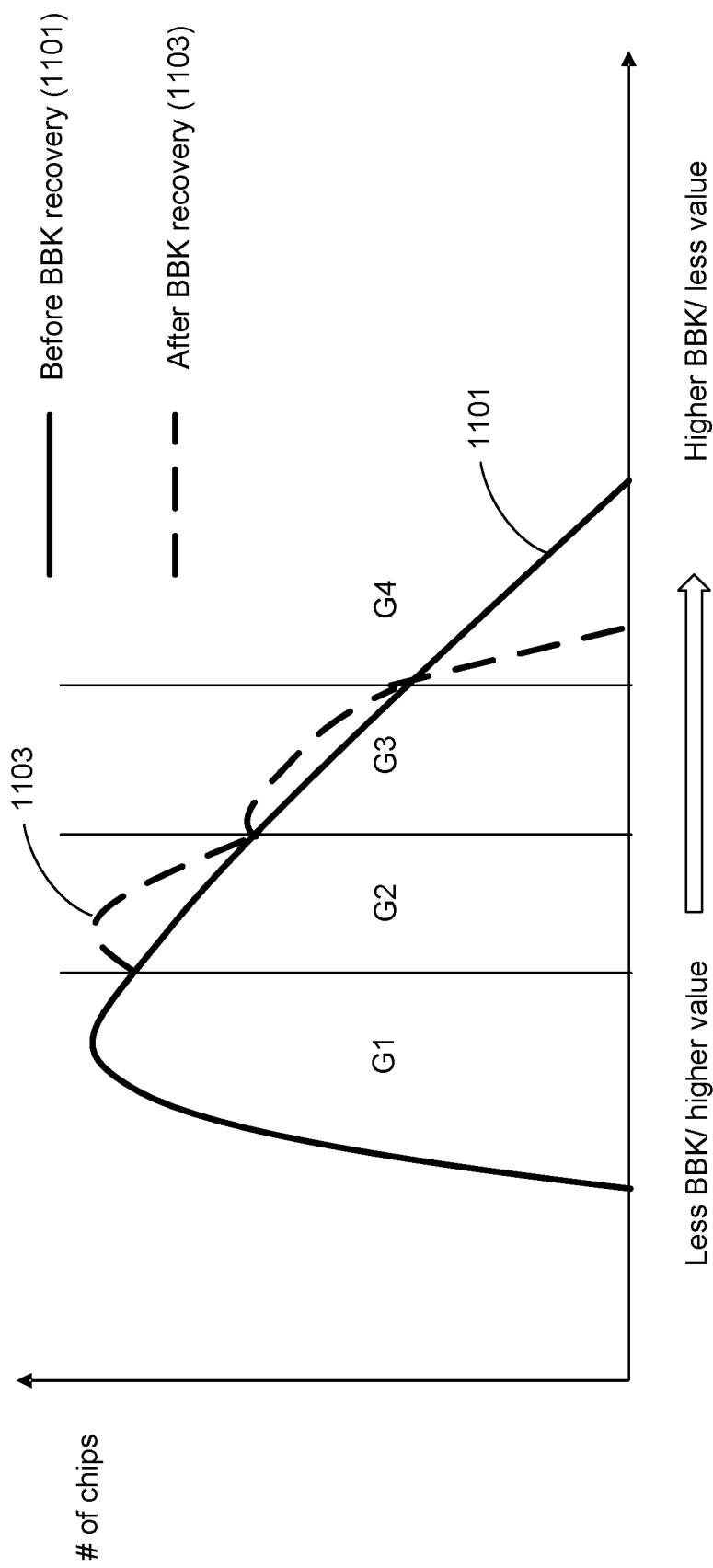
FIG. 11 illustrates the increase in the number of chips that can be used at higher value grades through use of the bad block recovery mechanism.

FIG. 11 illustrates the increase of the number of chips that can be used at higher value grades through use of the bad block recovery mechanism. FIG. 11 shows an example of a distribution of memory die based on their number of bad blocks, with the number of chips on the vertical axis and the number of bad blocks on the horizontal axis. Based upon the number of bad blocks, the memory die can be sorted in groups, with the higher value chips having fewer bad blocks and the chips with a higher bad block number being of lesser value. FIG. 11 illustrates the distribution grouped into four bins, G1, G2, G3, and G4. The distribution 1101 represented by the solid line corresponds to a grading based upon a single bad block bit, where for the G1 region the solid line 1101 and the broken line of 1103 overlap. The memory die of group G1 correspond to the highest quality specification, highest value chips that can be expected to have the longest lifetime in terms of program/erase cycles, with group G2 as medium quality specification devices, group G3 and lower quality specification devices, and group G4 as having too many bad blocks for most uses.

The distribution 1101 is based on the number of bad blocks using a binary 1-bit determination of whether or not a block is bad. The distribution 1103 shown with the broken line makes use of the bad block recovery described with respect to FIG. 10. In this example, the number of chips in the G1 bin is the same in both cases, but the numbers in the G2 and G3 bins have been increased. For example, if a memory die that would previously have been in the G3 or even G4 group has a number of blocks that have defects, but of the more recoverable categories such as R1 or R2, these chips could be moved into the G2 bin. This situation could arise if, to take one example, a die has a number of blocks with too may open memory holes to meet the strictest test specification, but can still meet a more relaxed criterion. Such blocks may have a somewhat shorter life expectancy, but can still usable in many applications. Similarly, many die that would be in the G4 group on a binary pass/fail basis for bad blocks may now be recoverable for G3.

Figure 12:
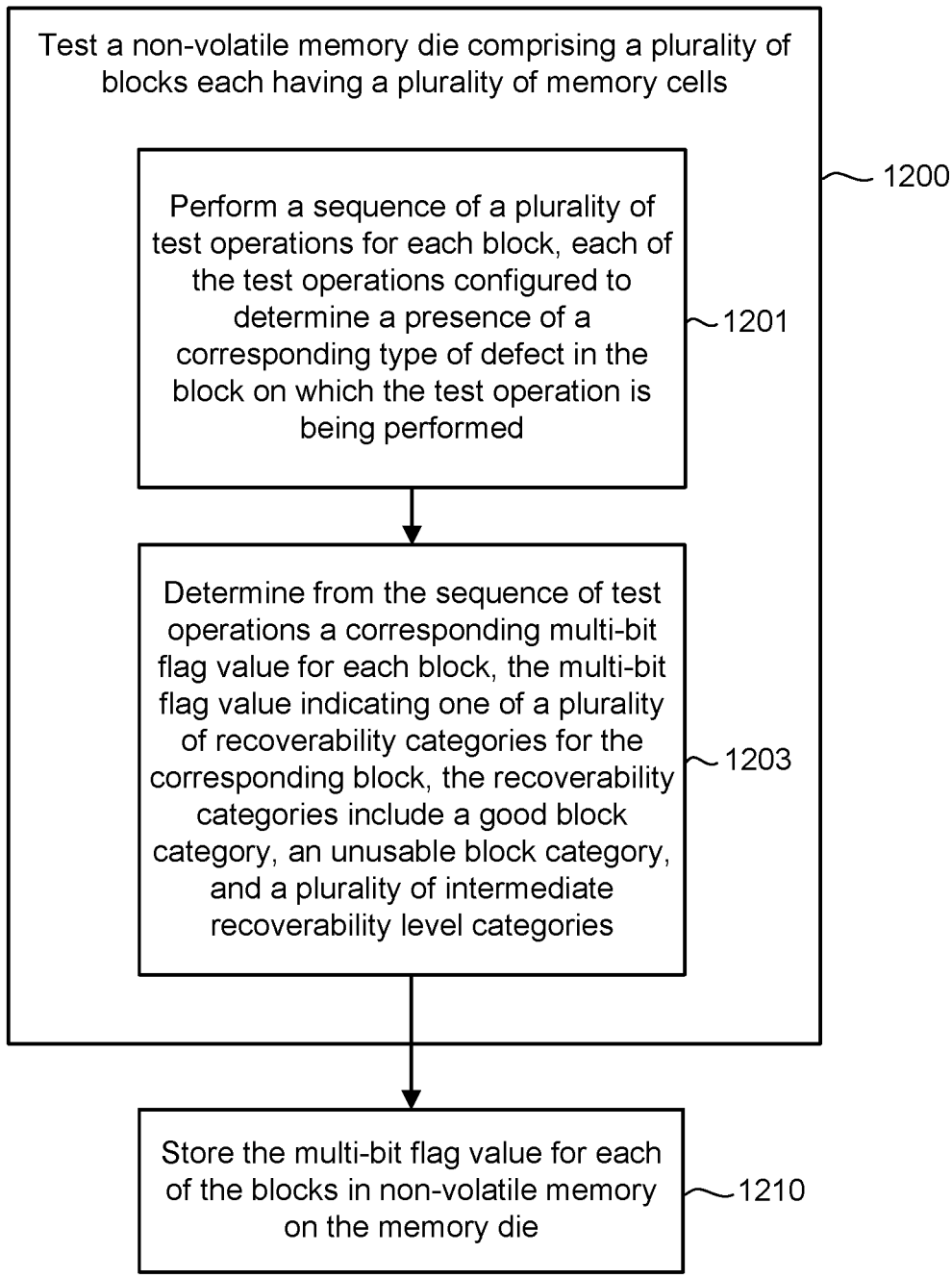
FIG. 12 is a flow chart for a high level description of one embodiment of a process for a die sort process that includes block quality classification.
Figure 13:
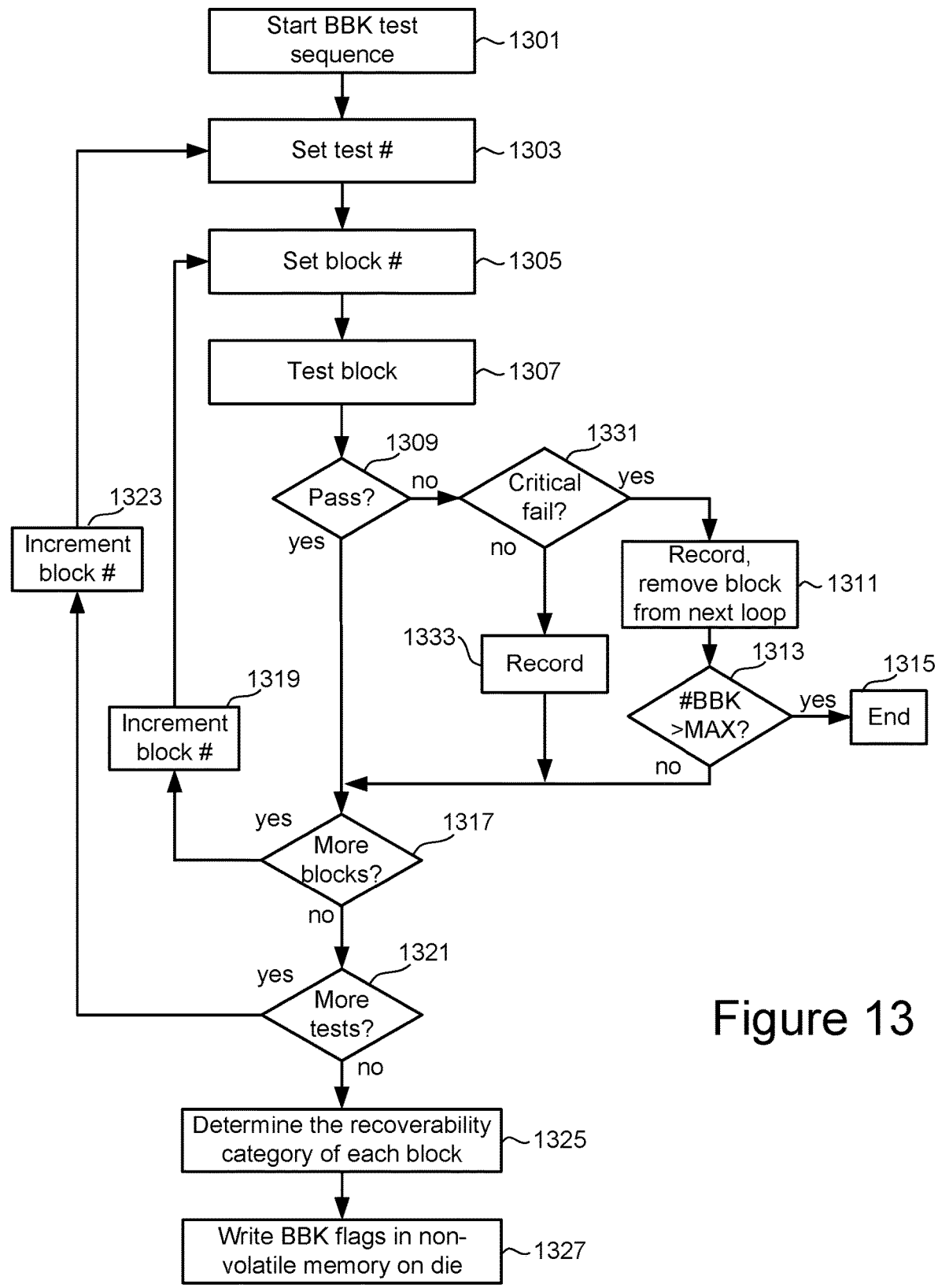
FIG. 13 is a flow chart describing one embodiment of a process for a die sort process that includes block quality classification in a more detailed implementation.

FIG. 12 is a flow chart for a high level description of one embodiment of a process for a die sort process that includes block quality classification. Step 1200 includes testing of a non-volatile memory die having multiple blocks, each of the blocks having multiple memory cells. As part of testing in step 1200, at step 1201 a sequence of a plurality of test operations is performed for each block. Each of the test operations is configured to determine a presence of a corresponding type of defect in the block on which the test operation is being performed. Also, as part of the testing in step 1200, a corresponding multi-bit flag value for each block is determined from the sequence of test operations at step 1203. As described above with respect to FIG. 10, the multi-bit flag value indicates one of a plurality of recoverability categories for the corresponding block, where the recoverability categories include a good block category, an unusable block category, and a plurality of intermediate recoverability level categories. Step 1210 stores the multi-bit flag value for each of the blocks in non-volatile memory on the memory die. FIG. 13 presents an example of a more detailed implementation for the process of FIG. 12, particularly for step 1201.

FIG. 13 is a flow chart describing one embodiment of a process for a die sort that includes block quality classification as in FIG. 12, but in a more detailed implementation. The embodiment presented in FIG. 13 is similar to that described above with respect to FIG. 9, but now instead of fail stop pass/not pass determination for each test on each block, the sort of quality determination described with respect to FIG. 10 is used. The process of FIG. 13, including the setting of the multi-bit BBK flags in a fuse ROM or other non-volatile memory on the die can be performed on a newly manufactured or "fresh" memory die prior to its being assembled into a memory package with other memory die or a controller and put into customer use. The testing is typically done using one or more external testing devices or equipment connected to the die, although in some embodiments some or all of the testing can be performed by the die itself using a built-in self-test (BIST) process.

Beginning at step 1301, the test is selected at step 1303, starting with the first test of the die sort sequence, and the block is selected at step 1305, starting with the first block in the test order. In the embodiment of FIG. 13, as in the embodiment of FIG. 9, the block loop is placed inside of the test loop, so that a given test is performed for all of the blocks before moving on to the next test, but in other embodiments the test loop can be placed inside of the block loop, so that all of the tests (or all tests until a fail stop) are performed for a block before moving on to the next block.

The selected test is performed on the selected block at step 1307 and step 1309 determines whether the block passed the test. If the block does not pass the test, the flow goes to step 1331 that determines whether the failed test is of the critical fail category. If not, the flow goes to step 1333 where the result of the test is recorded before continuing on to step 1317. As the test is not of the critical fail, there is no fail stop for the selected block and it will be included in the next of the sequence.

If the test fail detected at step 1309 is a critical fail, at step 1311 the selected block is removed from subsequent tests and recorded as (unrecoverably) bad. In some embodiments, step 1313 can be included to determine whether the accumulated number of blocks with a critical fail exceeds a maximum value and, if so, the die sort flow for the die can be ended at step 1315. If either the block passes the test at step 1309, or the accumulated number bad blocks is below the maximum value at 1313, the flow goes to step 1317 to determine whether there are more blocks for the current test.

Step 1317 determines whether there are more blocks to check for the current test and, if so, the flow loops back to step 1305 after incrementing the block number at step 1319, where any blocks previously determined as bad at step 1311 are skipped. If there are no more blocks for the current test, step 1321 determines whether there are more tests and, if so, the flow loops back to step 1303 after incrementing the test number at step 1323. If there are no more tests at step 1321, at 1325 the testing is complete and the recoverability categories of the blocks and corresponding flag values for the memory die can be determined as illustrated above with respect to FIG. 10. The multi-bit bad block flags for each of the blocks of the die can be stored on the die at step 1327, such as by setting the values in a ROM 320, such as a fuse ROM, or storing them in a system data block 620 of the non-volatile memory array (or both). When the die is subsequently in use, when the die is powered up the bad block flags can be read out by the controller so that the controller can skip the bad blocks when making block assignments.

Once the bad block information for a die is obtained as described with respect to FIGS. 10, 12 and 13, this information can be used during the die's operation and also for the selection of die for incorporation into a product. For example, if a high specification memory package 104 of FIG. 4 for memory system 100 of FIG. 1 is wanted, the memory die 292 for the package 104 can be selected from group G1 of FIG. 11, while for lower specification memory packages the die can be selected from groups G2 or G3 or a mixture of G1, G2 and G3 die, depending on the intended use. When assembling memory packages from a pool of memory die, the bad blocks flags of the die can be checked to the determine their quality level for making such die selections.

Figure 14:
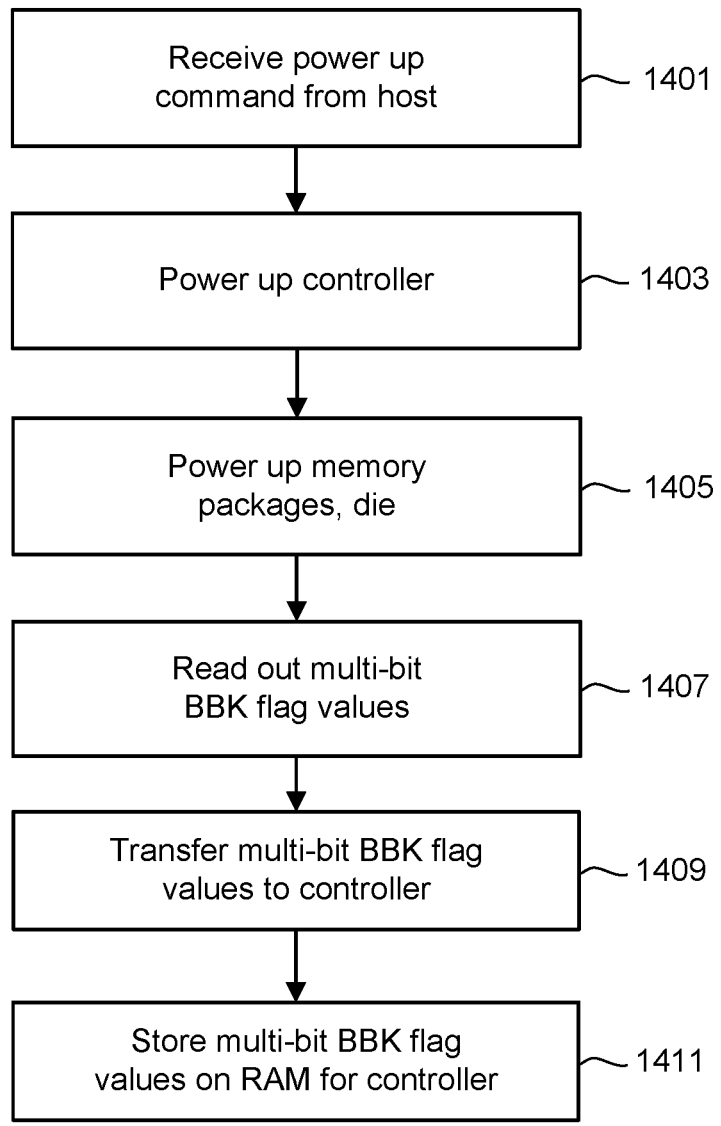
FIG. 14 is flow chart describing one embodiment of a process for a power on sequence of a memory system with die having multi-bit bad block flag values.

FIG. 14 is flow chart describing one embodiment of a process for a power on sequence of a memory system with die having multi-bit bad block flag values. Referring back to FIGS. 1-5 and 6B, at step 1401 the memory system 100 receives an access command or other signal causing power up. The memory controller 102 powers up at step 1403, sending power on commands to the memory packages 104 and their constituent memory die at step 1405. As part of the power on sequence, at step 1407 the on-die control circuitry 310 can read out the multi-bit bad block flag values from the ROM memory 320 or from a system data block 620. Although the discussion above has mainly focused on the multi-bit bad block flag values as determined and recorded as part of an device evaluation process of a fresh device, in some embodiments these flag values can be updated to reflect "grown" defects that occur once the device is in use. The multi-bit bad block flag data is then transferred from the memory die to the controller 102 at step 1409. The controller can then store flag values in operating memory for the controller (i.e., RAM memory for the controller, such as SRAM 160 or other accessible RAM on the controller or on a separate integrated circuit such as local memory (e.g. DRAM/ReRAM) 106), at step 1411, from where it can be accessed by other elements of the controller as needed, such as by memory processor 156 or media management layer MML 158. For example, when the media management layer MML 158 selects physical memory blocks for use when making a logical to physical address translation, blocks that are recorded as having a critical fail (an X category in FIG. 10) will not be selected at all, while the block quality information provided by the different recoverability categories can be used in the block selection process.

One example of the use of the block quality information is in wear leveling. Wear leveling is a technique that is used to try and equalize the wear levels across a die's (or memory system's) memory blocks so that the blocks age uniformly. Without wear leveling, some blocks may be rewritten more often than others, causing a die to become unusable because a small number of blocks are worn out, while others still have a long expected lifetime. A number of different wear leveling techniques are known, typically based on selecting memory blocks for writing based on the number of program/erase (P/E) cycles each of the blocks has undergone, a parameter often referred to as a hot count or experience count. When only a 1-bit bad block flag is used, the blocks are selected from the good blocks with blocks marked as bad not being used. When a multi-bit bad block flag is used, the quality information available from the multi-bit value can be used to incorporate the recoverable blocks into the wear leveling algorithms such that the recovered blocks can be used with less cycling in the wear leveling algorithm. The specifics of wear leveling algorithms vary, but FIG. 15 illustrates how the recoverability information on blocks can be incorporated into a generic wear leveling technique.

Figure 15:
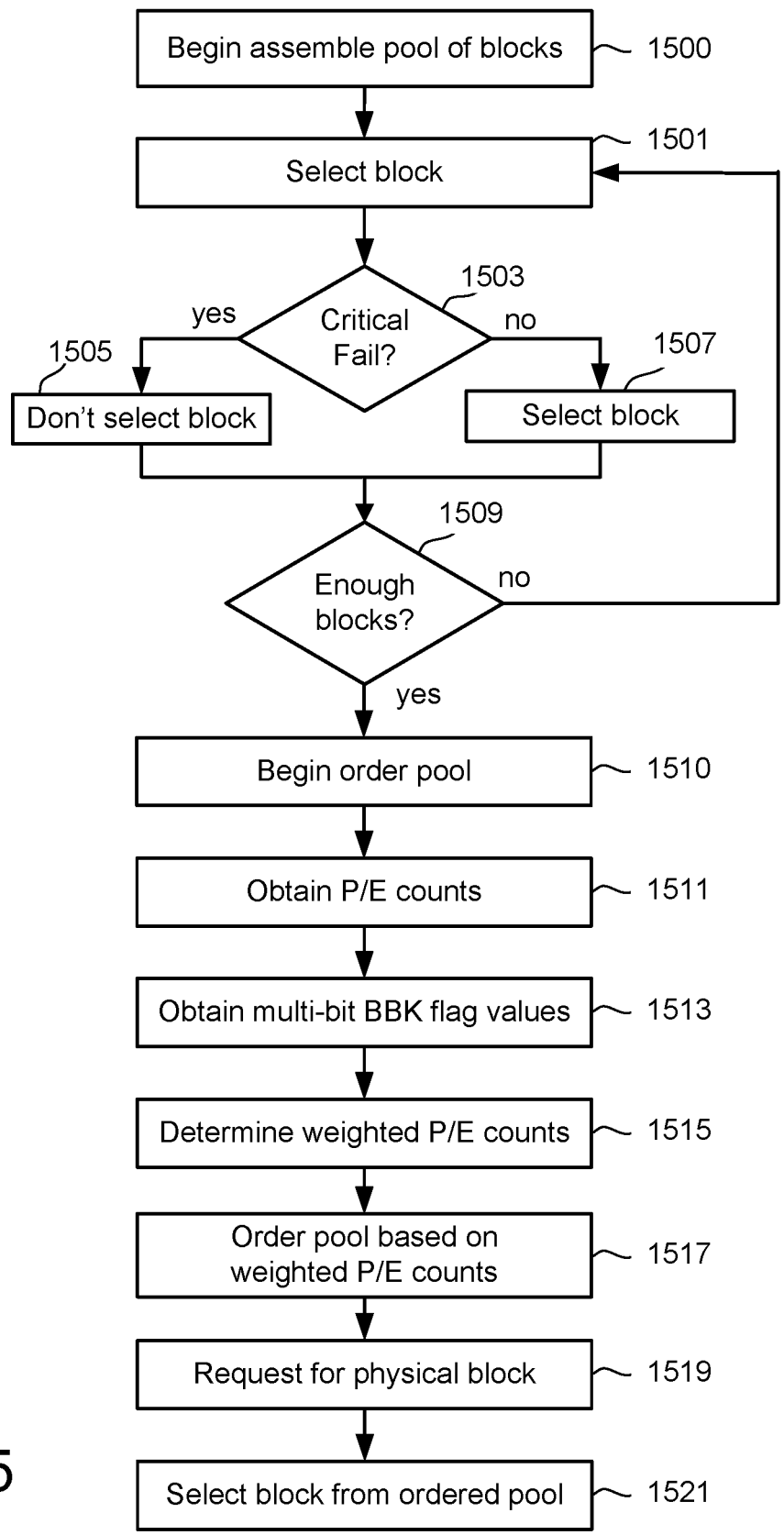
FIG. 15 is flow chart describing one embodiment of a wear leveling process that can incorporate the block quality, or recoverability, information provided by use of multi-bit values for the bad block flags.

FIG. 15 is flow chart describing one embodiment of a wear leveling process that can incorporate the block quality, or recoverability, information provided by use of multi-bit values for the bad block flags. The process begins by assembling, or replenishing, a pool of free blocks that are available to have data written to them, beginning at step 1500. From the free blocks, a block is selected at step 1501 and checked at step 1503 to see if its bad block flags indicate a critical fail (X in FIG. 10). If so, the block is not selected (step 1505); and if not, the block is selected and added to the pool (step 1507). Step 1509 determines whether enough blocks have been selected and, if not, the flow loops back to step 1501. Once enough blocks are selected, the flow moves on to step 1510 to begin ordering the blocks from the pool.

At step 1511 the program/erase (P/E) counts for each of the blocks of the pool are obtained. For example, these can be maintained by the controller in operating memory such as SRAM 160 from where they can be accessed by media management layer MML 158 and memory processor 156. At step 1513 the multi-bit bad block flag information for each of the blocks of the pool is accessed, where this information on the quality and recoverability of the block can have previously been transferred to controller 102 and stored in SRAM 160 in steps 1309 and 1311 of FIG. 13 as part of the power on sequence. As discussed above, the recoverability level or category (R1, R2, . . . ) can include information relevant to the expected lifetime of a block. For example, a block with a higher number of open memory holes as a fresh device will be able to tolerate fewer acquired errors as a result of program/erase cycling, so that its expected number of maximum of P/E cycles is lower than for a device that passed the open memory hole using the strictest specification. Consequently, in the embodiment of FIG. 15 the program erase count of a block can be weighted based upon the value of is bad block flags. This weighting is performed at step 1515. At step 1517 the pool of memory blocks is ordered based upon the weighted P/E counts to provide an ordered list of physical memory blocks from which the media management layer MML 158 can select when picking blocks for a write or erase operation.

As noted, the specifics of different wear leveling methods vary where, for example, they can be based on ordering the available blocks and using the values of the bad block flags when selecting a block for a write operation or actively moving blocks to help equalize wear. Typically, though, the process will involve some sort of ordering of blocks, which can be modified to include the block quality information available from the multi-bit bad block flag values, such as the weighting process just described. In any of these arrangements, when a request for an available block is received at step 1519, the selection of the block by media management layer MML 158 at step 1521 can be based on such a weighted list. The request for a block at step 1519 can based on a write command or erase command from a host or due an internal data relocation operation of host data (e.g., garbage collection, active wear leveling, etc.) and involve an assignment of a logical block address to the physical block, or can be an assignment of a block for system data (as for system block 620 of FIG. 6B).

As described above, rather than a memory die formed of multiple blocks having these blocks grouped into two categories of either good or bad as part of device testing, block classification can be extended to a number categories which can then be recorded on the die in multi-bit (e.g., 3 bit) bad block flags. This allows for the memory system to access blocks with various quality levels and differentiate them based upon their usage. For example, in lower endurance products, block recovery based upon the multi-bit bad block flags can be used so that the effective number of good blocks increases. This can allow the memory controller to use blocks having higher levels of defects with less cycling in wear leveling algorithms, for example.

One embodiment includes a method that includes testing a non-volatile memory die comprising a plurality of blocks, each block having a plurality of memory cells. The testing includes: performing a sequence of a plurality of test operations for each block, each of the test operations configured to determining a presence of a corresponding type of defect in the block on which the sequence of test operation is being performed; and determining from the sequence of test operations a multi-bit flag value for each block, the multi-bit flag value indicating one of a plurality of recoverability categories of a corresponding block, the recoverability categories include a good block category, an unusable block category, and one or more intermediate recoverability level categories. The method also includes recording the multi-bit flag value for each of the blocks in non-volatile memory on the memory die.

Still another embodiment includes a non-volatile memory system including a memory die and a memory controller connected to the memory die. The memory die includes: a plurality of blocks each comprising a plurality of non-volatile memory cells; and a non-volatile system memory section storing, for each of the blocks, a multi-bit flag value indicating one of a plurality of recoverability categories of a corresponding block, the recoverability categories include a good block category, an unusable block category, and one or more intermediate recoverability level categories. The memory controller is configured to: perform a power on sequence for the memory die, the power on sequence including reading out to the multi-bit flag values from the memory die and storing the multi-bit flag values in operating memory for the memory controller; and select blocks of the memory die in which the memory controller selects blocks based upon an ordering of the blocks weighted by the recoverability category of each of the blocks being ordered.

One embodiment includes a non-volatile memory die including a plurality of blocks each comprising a plurality of non-volatile memory cells and a non-volatile system memory storing, for each of the blocks, a multi-bit flag value indicating one of a plurality of recoverability categories for a corresponding block, and the recoverability categories include a good block category, an unusable block category, and one or more intermediate recoverability level categories. The memory die also includes one or more on-die control circuits connected to the blocks and to the non-volatile system memory, the one or more control circuits are configured to write data to and read data from the blocks, and to read the plurality of multi-bit flag values and provide the plurality of multi-bit flag values externally to the memory die during a power on sequence.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A method, comprising:
    testing a non-volatile memory die comprising a plurality of blocks each having a plurality of memory cells, comprising:
        performing a sequence of a plurality of test operations for each block, each of the test operations configured to determine a presence of a corresponding type of defect, including a plurality of defect categories, in the block on which the test operation is being performed; and
        determining from the sequence of test operations a corresponding multi-bit flag value for each block, the multi-bit flag value indicating one of a plurality of recoverability categories for the corresponding block, the recoverability categories include a good block category, an unusable block category, and a plurality of intermediate recoverability level categories;
    storing the multi-bit flag value for each of the blocks in non-volatile memory on the memory die;
    grading the memory die into one of a plurality of groups of quality specifications based on the multi-bit flag values; and
    assembling the memory die into a non-volatile memory package comprised of multiple memory die selected from a plurality of different groups of quality specifications.

2. The method of claim 1, wherein:
    the types of defects include a plurality of categories of error.

3. The method of claim 1, wherein:
    the types of defects include a plurality of degrees of error of a category of error.

4. The method of claim 1, wherein performing the sequence of test operations for each block further includes:
    determining whether a block fails a test operation of a critical category; and
    in response to the to the block failing the test operation of the critical category, setting the recoverability category of the block failing the test operation as the unusable block category.

5. The method of claim 4, wherein performing the sequence of test operations for each block further includes:
    in response to the block failing the test operation of the critical category, discontinuing performing of the sequence of test operations for the block.

6. The method of claim 1, wherein storing the multi-bit flag value for each of the blocks in non-volatile memory on the memory die includes:
    writing the multi-bit flag values in a fuse ROM memory on the memory die.

7. The method of claim 1, wherein storing the multi-bit flag value for each of the blocks in non-volatile memory on the memory die includes:
    writing the multi-bit flag values in a block of the memory die.

8. The method of claim 1, wherein performing a sequence of a plurality of test operations for each block includes:
    performing each test operation of the sequence on all of the blocks prior to performing a subsequent test operation of the sequence on the blocks.

9. A non-volatile memory system, comprising:
    a plurality of memory die, each comprising:
        a plurality of blocks each comprising a plurality of non-volatile memory cells; and
        a non-volatile system memory section storing, for each of the blocks, a multi-bit flag value indicating one of a plurality of recoverability categories of a corresponding block, the recoverability categories including a good block category, an unusable block category, and a plurality of recoverability level categories,
    the plurality of memory die including memory die selected from a plurality of different groups of quality specifications based on the multi-bit flag values; and
    a memory controller connected to the plurality of memory die and configured to:
        perform a power on sequence for each of the memory die, the power on sequence including reading out the multi-bit flag values from the memory die and storing the multi-bit flag values in operating memory for the memory controller; and
        select blocks of each of the memory die based upon a corresponding ordering of the blocks weighted by the recoverability category of each of the blocks in the ordering.

10. The non-volatile memory system of claim 9, wherein the memory controller is further configured to:
    maintain, for each of the blocks, a count for a number of program/erase cycles experienced by the block, wherein the ordering of the blocks is based upon the blocks' count of the number of program/erase cycles experienced by each block weighted by the block's recoverability category.

11. The non-volatile memory system of claim 9, wherein:
    when the memory controller selects blocks, blocks of an unusable block category are not selected.

12. The non-volatile memory system of claim 9, wherein:
    the ordering of the blocks is for use in a wear leveling operation.

13. The non-volatile memory system of claim 9, wherein:
the memory controller selects the blocks for an internal data relocation operation initiated by the memory controller.

14. A method, comprising:
receiving a plurality of non-volatile memory die comprising a plurality of blocks each having a plurality of memory cells, each of the non-volatile memory die storing a multi-bit flag value for each of the blocks in non-volatile memory on the memory die indicating one of a plurality of recoverability categories for the corresponding block, the recoverability categories include a good block category, an unusable block category, and a plurality of intermediate recoverability level categories;
storing the multi-bit flag value for each of the blocks in non-volatile memory on the memory die;
grading the memory die into one of a plurality of groups of quality specifications based on the multi-bit flag values; and
assembling the memory die into a non-volatile memory package comprised of multiple memory die selected from a plurality of different groups of quality specifications.

15. The method of claim 14, wherein:
the types of defects include a plurality of categories of error.

16. The method of claim 14, wherein:
the types of defects include a plurality of degrees of error of a category of error.

17. The method of claim 14, wherein the multi-bit flag values for each of the die are stored in a fuse ROM memory on the memory die.

18. The method of claim 14, wherein the multi-bit flag value is stored in a block of the memory die.

* * * * *